(12) United States Patent
Cho et al.

(10) Patent No.: US 9,577,076 B2
(45) Date of Patent: Feb. 21, 2017

(54) METHODS OF MANUFACTURING SEMICONDUCTOR DEVICES

(71) Applicant: Samsung Electronics Co., Ltd., Suwon-si (KR)

(72) Inventors: Keun-Hwi Cho, Seoul (KR);
Dong-Won Kim, Seongnam-si (KR);
Yoshinao Harada, Hwaseong-si (KR);
Myung-Gil Kang, Seoul (KR);
Jae-Young Park, Yongin-si (KR)

(73) Assignee: Samsung Electronics Co., Ltd (KR)

( * ) Notice: Subject to any disclaimer, the term of this patent is extended or adjusted under 35 U.S.C. 154(b) by 50 days.

(21) Appl. No.: 14/612,797

(22) Filed: Feb. 3, 2015

(65) Prior Publication Data
US 2015/0325683 A1 Nov. 12, 2015

(30) Foreign Application Priority Data

May 7, 2014 (KR) ........................ 10-2014-0054281

(51) Int. Cl.
| H01L 29/66 | (2006.01) |
| H01L 21/265 | (2006.01) |
| H01L 21/324 | (2006.01) |
| H01L 21/8238 | (2006.01) |
| H01L 21/84 | (2006.01) |

(52) U.S. Cl.
CPC ... H01L 29/66803 (2013.01); H01L 21/26513 (2013.01); H01L 21/324 (2013.01); H01L 21/823821 (2013.01); H01L 21/845 (2013.01); H01L 29/66537 (2013.01); H01L 29/66545 (2013.01); H01L 29/66795 (2013.01)

(58) Field of Classification Search
CPC .................. H01L 21/324; H01L 29/66803
See application file for complete search history.

(56) References Cited

U.S. PATENT DOCUMENTS

| 7,745,887 | B2 | 6/2010 | Kim et al. |
| 8,492,848 | B2 | 7/2013 | Gluschenkov et al. |
| 2008/0261366 | A1 | 10/2008 | Jeon et al. |
| 2010/0120245 | A1 | 5/2010 | Tjandra et al. |
| 2012/0015503 | A1* | 1/2012 | Yao ................... H01L 21/26506 438/478 |
| 2012/0214286 | A1 | 8/2012 | Lin et al. |
| 2012/0309145 | A1* | 12/2012 | Song ............... H01L 21/823807 438/217 |
| 2013/0154002 | A1 | 6/2013 | Kuo et al. |
| 2013/0240957 | A1 | 9/2013 | Lee et al. |
| 2014/0183666 | A1* | 7/2014 | Pramanik .............. H01L 29/401 257/412 |
| 2014/0346615 | A1* | 11/2014 | Zhang ............... H01L 21/28158 257/411 |

FOREIGN PATENT DOCUMENTS

| KR | 2003093803 | 12/2003 |
| KR | 2010079139 | 7/2010 |

* cited by examiner

*Primary Examiner* — Duy T Nguyen
*Assistant Examiner* — Mounir Amer
(74) *Attorney, Agent, or Firm* — Onello & Mello, LLP.

(57) ABSTRACT

In a method of manufacturing a semiconductor device, a plasma annealing and supplying a threshold voltage control gas onto a portion of a substrate is performed to form a fixed charge region including a fixed charge at a surface of the substrate. A MOS transistor is formed on the substrate including the fixed charge region. By the above processes, the threshold voltage of the MOS transistor may be easily controlled.

15 Claims, 42 Drawing Sheets

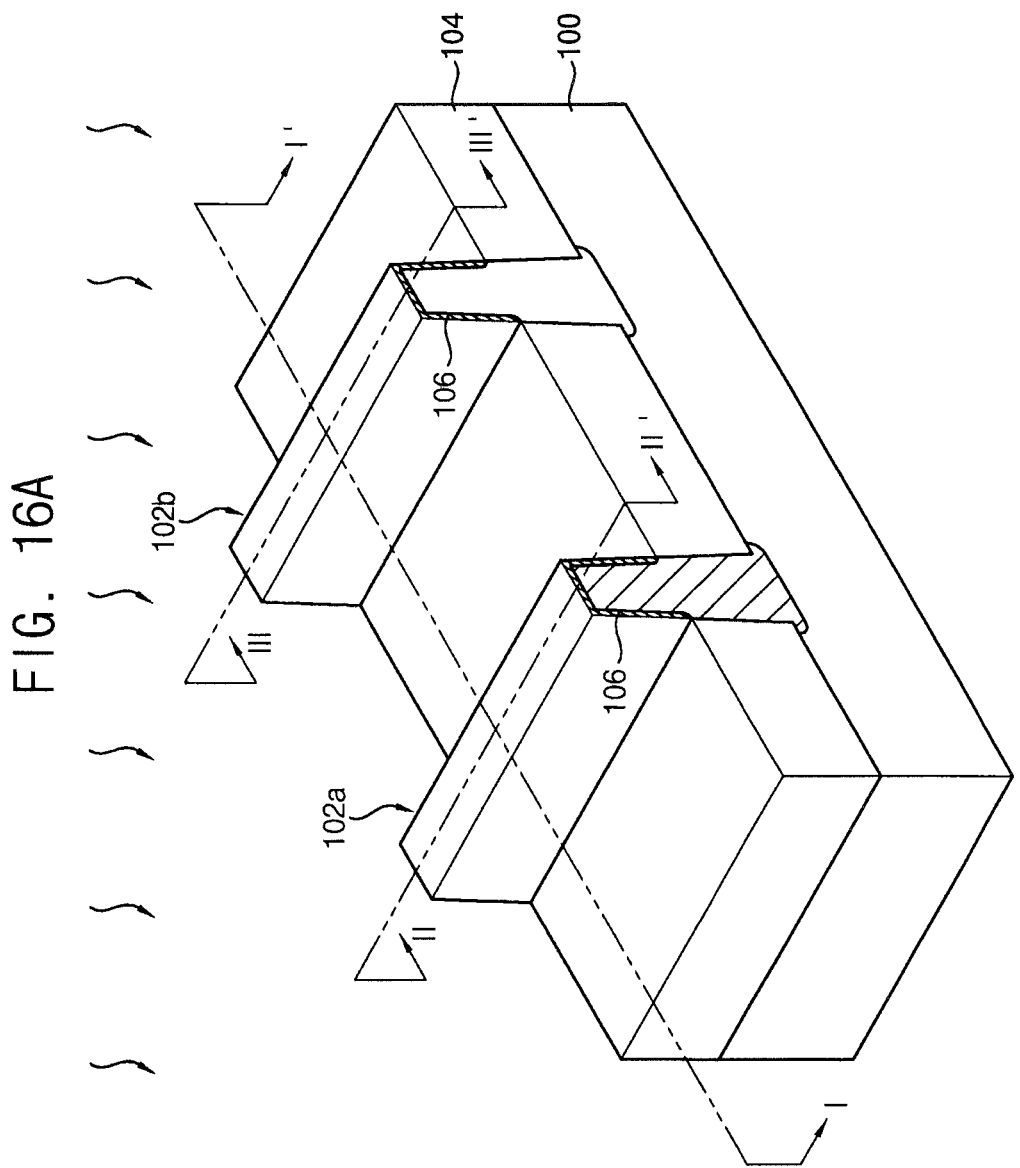

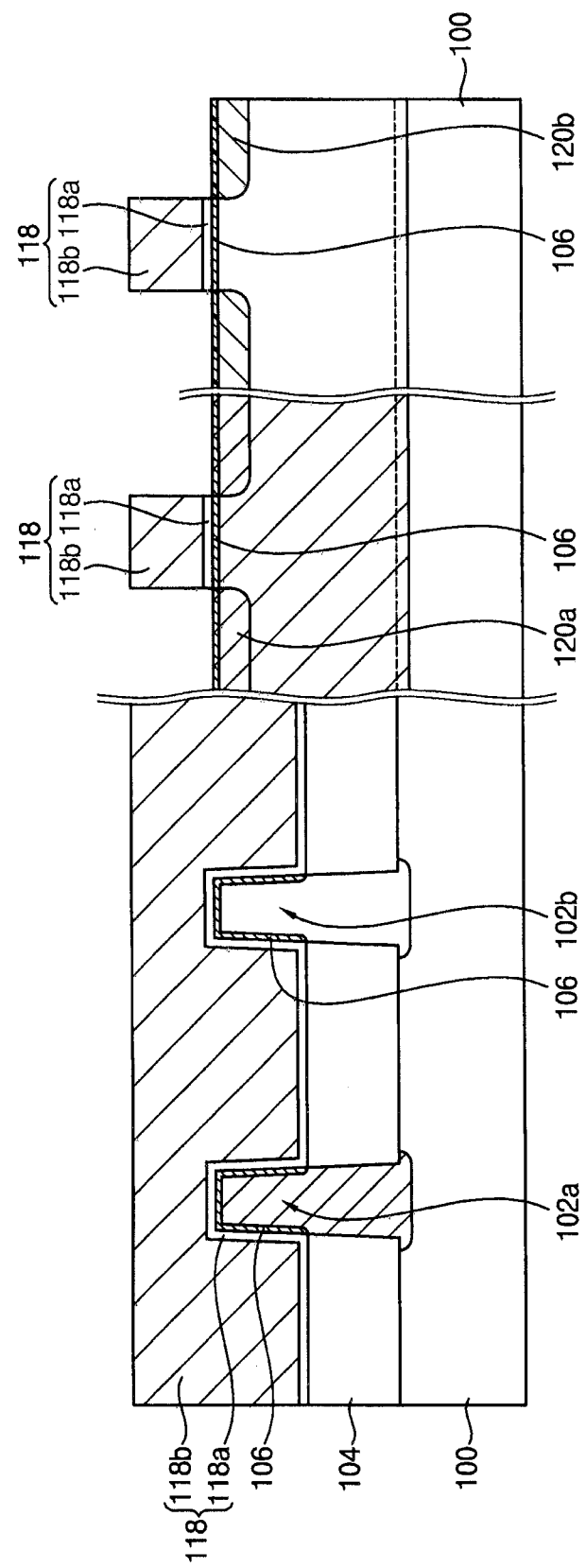

METHODS OF MANUFACTURING SEMICONDUCTOR DEVICES

CROSS-REFERENCE TO RELATED APPLICATION

This application claims priority under 35 USC §119 to Korean Patent Application No. 10-2014-0054281, filed on May 7, 2014 in the Korean Intellectual Property Office (KIPO), the content of which is herein incorporated by reference in its entirety.

BACKGROUND

1. Field

Example embodiments relate to methods of manufacturing semiconductor devices. More particularly, example embodiments relate to methods of manufacturing semiconductor devices including transistors.

2. Description of the Related Art

There is continuous pressure to improve the operation characteristics of transistors formed in semiconductor devices. In particular, the threshold voltage of transistors and methods for controlling the threshold voltage of a transistor are being researched.

SUMMARY

Example embodiments provide a method of manufacturing semiconductor devices including transistors having a desired threshold voltage.

According to example embodiments, there is provided a method of manufacturing a semiconductor device. In the method, a plasma annealing and supplying a threshold voltage control gas onto a portion of a substrate is performed to form a fixed charge region including a fixed charge at a surface of the substrate. A MOS transistor is formed on the substrate including the fixed charge region.

In example embodiments, the threshold voltage control gas may be supplied onto a channel region, and source and drain regions of the MOS transistor in the substrate, and the fixed charge region may be formed at the channel region, and the source and drain regions.

In example embodiments, the threshold voltage control gas may be supplied onto a channel region of the MOS transistor in the substrate, and the fixed charge region may be formed at the channel region.

In example embodiments, the threshold voltage control gas may be supplied onto source and drain regions of the MOS transistor in the substrate, and the fixed charge region may be formed at the source and drain regions, and an edge portion of a channel region of the MOS transistor.

In example embodiments, before performing the plasma annealing and supplying the threshold voltage control gas, a blocking layer pattern may further formed on the substrate.

In example embodiments, the threshold voltage control gas may have an atomic number smaller than that of an element of the substrate.

In example embodiments, the threshold voltage control gas may include at least one selected from the group consisting of H, $H_2$, $D_2$ (deuterium), He, C and F.

In example embodiments, the plasma annealing may be performed at a temperature of about 400 C to about 600 C.

In example embodiments, before performing the plasma annealing and supplying the threshold voltage control gas, an active fin and isolation layer may be further formed on the substrate.

In example embodiments, when the MOS transistor is formed, a gate structure including a gate insulation layer and a gate electrode may be sequentially formed on the substrate including the fixed charge region. Also, an impurity region may be formed at an upper portion of the substrate adjacent to the gate structure.

According to example embodiments, there is provided a method of manufacturing a semiconductor device. In the method, an active fin and isolation layer may be formed on a substrate. A plasma annealing and supplying a threshold voltage control gas onto the substrate is performed to form a fixed charge region including a fixed charge at a surface of the substrate. A gate structure including a gate insulation layer and a gate electrode may be sequentially formed on the substrate including the fixed charge region. An impurity region may be formed at an upper portion of the substrate adjacent to the gate structure.

In example embodiments, the threshold voltage control gas may have an atomic number smaller than that of an element of the substrate.

In example embodiments, the substrate may include a first region for forming a first transistor of a first conductivity and a second region for forming a second transistor of a second conductivity. Blocking layer patterns may further formed to cover the first or second region of the substrate so that the threshold voltage control gas may be supplied onto an exposed portion of the substrate between the blocking layer patterns.

In example embodiments, an insulating layer pattern may be formed to have having an opening exposing a channel region of the substrate. The threshold voltage control gas may be supplied to the channel region of the substrate exposed by the opening. The gate structure may be formed in the opening.

In example embodiments, before performing the plasma annealing and supplying the threshold voltage control gas, a gate insulation layer may be further formed on the substrate.

In example embodiments, the plasma annealing may be performed at a temperature of about 400 C to about 600 C.

In example embodiments, the plasma annealing may be performed under a pressure of about 0.1 Torr to about 5 Torr.

According to example embodiments, there is provided a method of manufacturing a semiconductor device. In the method, an active region including an active fin and isolation layer may be formed on a substrate. A gate structure including a gate insulation layer and a gate electrode may be sequentially formed on the substrate. A plasma annealing and supplying a threshold voltage control gas onto the substrate is performed to form a fixed charge region including a fixed charge at a surface of the substrate. An impurity region may be formed at an upper portion of the substrate adjacent to the gate structure.

In example embodiments, the threshold voltage control gas may have an atomic number smaller than that of an element of the substrate.

In another aspect, a method of manufacturing a semiconductor device, comprises: performing a plasma annealing on a region of a substrate while supplying a threshold voltage supply gas to form a fixed charge region; and forming a transistor in the region of the substrate, the transistor including the fixed charge region, a threshold voltage of the transistor being controlled in accordance with the plasma annealing while supplying the threshold voltage supply gas.

In some embodiments, the fixed charge region is formed on a selected region of the substrate corresponding to a channel region of the transistor.

In some embodiments, the fixed charge region is formed on a selected region of the substrate corresponding to source and drain regions of the transistor.

In some embodiments, performing a plasma annealing on a region of a substrate while supplying a threshold voltage supply gas to form a fixed charge region is performed through an opening formed as a result of the forming and removal of a dummy gate pattern.

In some embodiments, performing a plasma annealing on a region of a substrate while supplying a threshold voltage supply gas to form a fixed charge region is performed through a gate insulating layer of a gate of the resulting transistor.

According to example embodiments, the semiconductor device may be simply manufactured to include the transistor having a target threshold voltage.

BRIEF DESCRIPTION OF THE DRAWINGS

Example embodiments will be more clearly understood from the following detailed description taken in conjunction with the accompanying drawings. FIGS. 1 to 47 represent non-limiting, example embodiments as described herein.

FIGS. 5 and 6 are cross-sectional views illustrating stages of a method of manufacturing a semiconductor device in accordance with example embodiments of the present inventive concepts;

FIGS. 7 to 9 are cross-sectional views illustrating stages of a method of manufacturing a semiconductor device in accordance with example embodiments of the present inventive concepts;

FIGS. 10 to 14 are cross-sectional views illustrating stages of a method of manufacturing a semiconductor device in accordance with example embodiments of the present inventive concepts;

FIGS. 15A, 16A, 17A, 18A, 19A and 20A are perspective views illustrating stages of a method of manufacturing a semiconductor device in accordance with example embodiments of the present inventive concepts;

FIGS. 15B, 16B, 17B, 18B, 19B and 20B are cross-sectional views illustrating the stages of the method of manufacturing the semiconductor device in accordance with example embodiments of the present inventive concepts;

FIGS. 21 to 24 are cross-sectional views illustrating stages of a method of manufacturing a semiconductor device in accordance with example embodiments of the present inventive concepts;

FIGS. 25 to 27 are cross-sectional views illustrating stages of a method of manufacturing a semiconductor device in accordance with example embodiments of the present inventive concepts;

FIGS. 28 and 29 are cross-sectional views illustrating stages of a method of manufacturing a semiconductor device in accordance with example embodiments of the present inventive concepts;

FIGS. 30 and 31 are cross-sectional views illustrating stages of a method of manufacturing a semiconductor device in accordance with example embodiments of the present inventive concepts;

FIGS. 32 to 34 are cross-sectional views illustrating stages of a method of manufacturing a semiconductor device in accordance with example embodiments of the present inventive concepts;

FIGS. 35 and 36 are cross-sectional views illustrating stages of a method of manufacturing a semiconductor device in accordance with example embodiments of the present inventive concepts;

FIGS. 37 and 38 are cross-sectional views illustrating stages of a method of manufacturing a semiconductor device in accordance with example embodiments of the present inventive concepts;

FIG. 39 is cross-sectional views illustrating stages of a method of manufacturing a semiconductor device in accordance with example embodiments of the present inventive concepts;

FIGS. 40 and 41 are cross-sectional views illustrating stages of a method of manufacturing a semiconductor device in accordance with example embodiments of the present inventive concepts;

FIGS. 42 and 43 are cross-sectional views illustrating stages of a method of manufacturing a semiconductor device in accordance with example embodiments of the present inventive concepts;

FIGS. 44 and 45 are cross-sectional views illustrating stages of a method of manufacturing a semiconductor device in accordance with example embodiments;

FIG. 46 is a graph illustrating threshold voltages of NMOS transistors of Example 1 and threshold voltages of NMOS transistors of Comparative Example 1; and FIG. 47 is a graph illustrating threshold voltages of PMOS transistors of Example 2 and threshold voltages of PMOS transistors of Comparative Example 2.

DESCRIPTION OF EMBODIMENTS

Figure 1A:
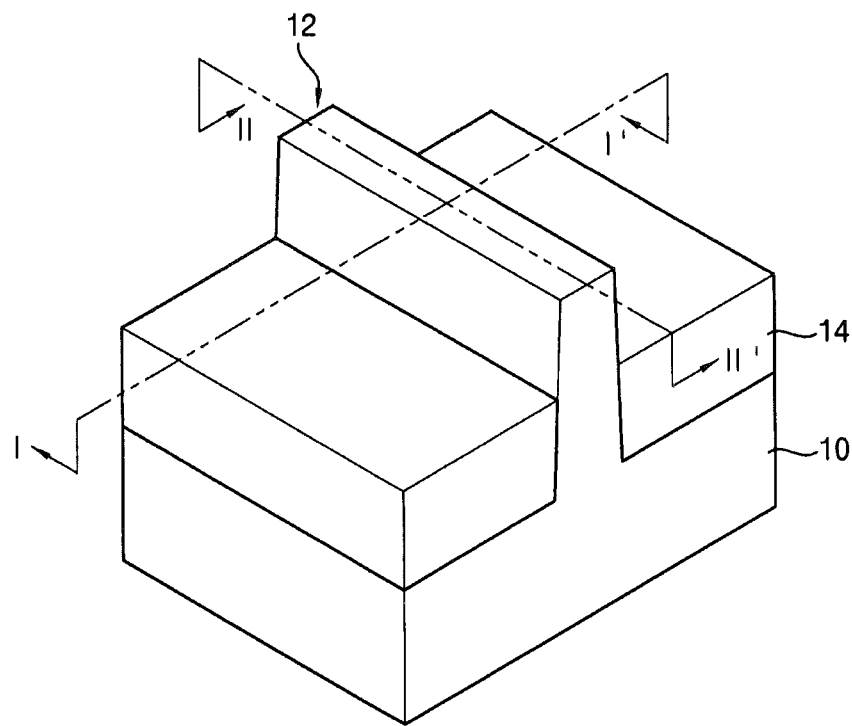
FIGS. 1A, 2A, 3A and 4A are perspective views illustrating stages of a method of manufacturing a semiconductor device in accordance with example embodiments.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A, 2A, 3A and 4A are perspective views illustrating stages of a method of manufacturing a semiconductor device in accordance with example embodiments. FIGS. 1B, 2B, 3B and 4B are cross-sectional views illustrating the stages of the method of manufacturing the semiconductor device in accordance with example embodiments.

FIGS. 1B, 2B, 3B and 4B show cross-sectional views cut along a cross-sectional line I-I' and a cross-sectional line II-II' of FIG. 1A.

Figure 1B:
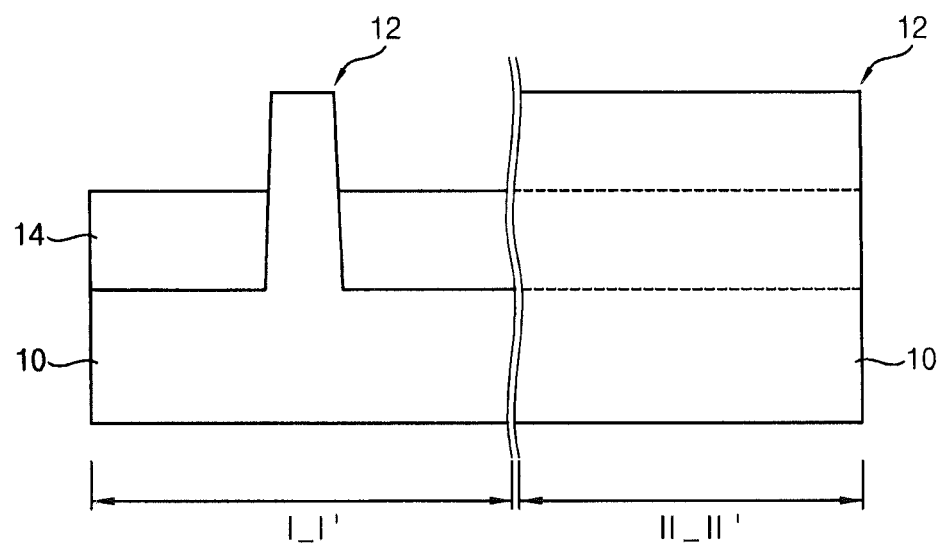
FIGS. 1B, 2B, 3B and 4B are cross-sectional views illustrating the stages of the method of manufacturing the semiconductor device in accordance with example embodiments of the present inventive concepts.

Referring to FIGS. 1A and 1B, a substrate 10 may be partially etched to form a trench (not shown), and an isolation layer 14 may be formed in a lower portion of the trench.

In some embodiments, the substrate 10 may comprise a silicon substrate, a germanium substrate, a silicon-germanium substrate, a silicon-on-insulator (SOI) substrate, a germanium-on-insulator (GOI) substrate, or other suitable substrate material.

In some embodiments, an insulation layer may be formed on the substrate 10 to fill the trench, and the insulation layer may be planarized until a top surface of the substrate 10 may be exposed. An upper portion of the insulation layer may be removed to expose an upper sidewall of the trench, and thus, in this manner, the isolation layer 14 may be formed. In some embodiments, the insulation layer may include an oxide, e.g., silicon oxide, or other suitable insulation material.

In some embodiments, substrate 10 may be divided into a field region on which the isolation layer 14 is formed and an active region on which no isolation layer 14 is formed. In some embodiments, active region may have a fin-like shape protruding from the field region, and thus the active region may be referred to as an active fin 12.

In some embodiments, impurities may be lightly doped onto the active fin 12 to form a channel doping region (not shown) of a transistor. For example, the channel doping region of an n-type transistor may be doped with p-type impurities, and the channel doping region of a p-type transistor may be doped with n-type impurities.

Figure 2A:
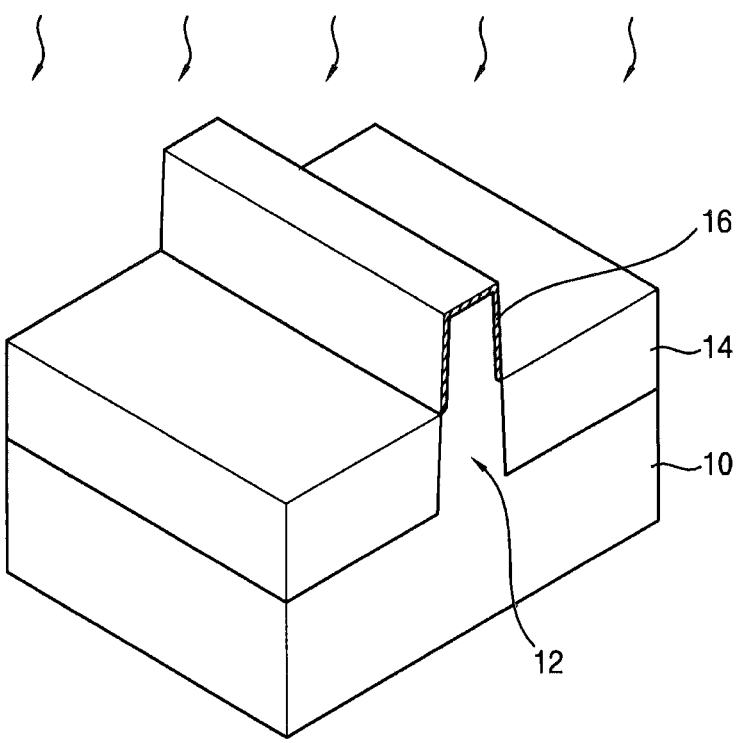
Figure 2B:
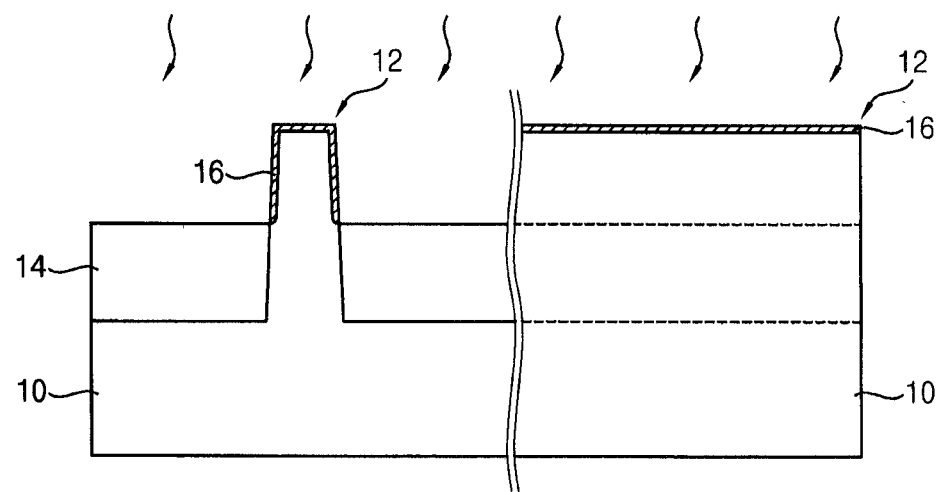

Referring to FIGS. 2A and 2B, a plasma annealing may be performed while supplying a threshold voltage control gas onto the substrate 10. In accordance with the plasma annealing process, a fixed charge region 16 may be formed at a surface of the substrate 10. The fixed charge region 16 may include a fixed charge for controlling the threshold voltage of the transistor. In some embodiments, the fixed charge region 16 may be formed at an entire surface of the exposed active fin 12. Alternatively, in other embodiments, the fixed charge region 16 may be formed at surfaces of the active fin 12 serving as a channel region, and source and drain regions of the transistor.

The threshold voltage control gas may be readily bonded with dangling bonds and/or defect portions of the surface of the substrate 10, and those portions bonding with the surface of the substrate 10 may be readily broken and removed. Thus, the threshold voltage control gas may include a gas having an atomic number less than that of an element of the substrate 10. In some embodiments, the threshold voltage control gas may include, e.g., H, $H_2$, $D_2$ (deuterium), He, C, F, and the like.

In the plasma annealing process, the parameters of temperature and pressure may be optimized so that the threshold voltage control gas may penetrate into the surface of the substrate 10, and may be trapped and/or detrapped thereby/therefrom. In example embodiments, the plasma annealing process may be performed a temperature of about 400 C to about 600 C under a pressure of about 0.1 Torr to about 5 Torr.

By the plasma annealing process, the threshold voltage control gas may be trapped by a sidewall and a top surface of the active fin 12, and then may be detrapped or freed therefrom. A portion of the substrate 10 from which the threshold voltage control gas is detrapped may become charged, unlike the state of the substrate prior to performing the plasma annealing process. That is, the portion of the substrate 10 undergoing the annealing/detrapping process may serve as the fixed charge region 16 having a positive fixed charge or a negative fixed charge, according to a type of the threshold voltage control gas. Also, a portion of the substrate 10 by which the threshold voltage control gas is trapped may additionally serve as the fixed charge region 16.

Due to the fixed charge generated by the plasma annealing at the surface of the active fin 12, an effective work function of the surface of the active fin 12 may be changed. Thus, the threshold voltage of the transistor subsequently formed on the active fin 12 may be changed or altered in a controlled fashion.

For example, when a positive fixed charge is formed at the surface of the active fin 12, NMOS and PMOS transistors formed on the active fin 12 having the positive fixed charge may have threshold voltages lower than those of NMOS and PMOS transistors formed on the active fin 12 having no fixed charge, respectively. Due to the positive fixed charge, the threshold voltage of the NMOS transistor may be caused to relatively decrease, and an absolute value of the threshold voltage of the PMOS transistor may be caused to relatively increase.

Alternatively, when a negative fixed charge is formed at the surface of the active fin 12, NMOS and PMOS transistors subsequently formed on the active fin 12 having the negative fixed charge may have threshold voltages higher than those of NMOS and PMOS transistors formed on an active fin having no fixed charge, respectively. Due to the negative fixed charge, the threshold voltage of the NMOS transistor may be caused to relatively increase, and an absolute value of the threshold voltage of the PMOS transistor may be caused to relatively decrease.

In example embodiments, when the threshold voltage control gas includes helium (He), the fixed charge region 16 including a positive fixed charge may be formed at the sidewalls and the top surface of the active fin 12. As a result, each of threshold voltages of NMOS and PMOS transistors formed on the active fin 12 having the positive fixed charge may relatively decrease. As illustrated above, in some embodiments, the threshold voltage of the transistor may be controlled by the plasma annealing and supplying the threshold voltage control gas.

Figure 3A:
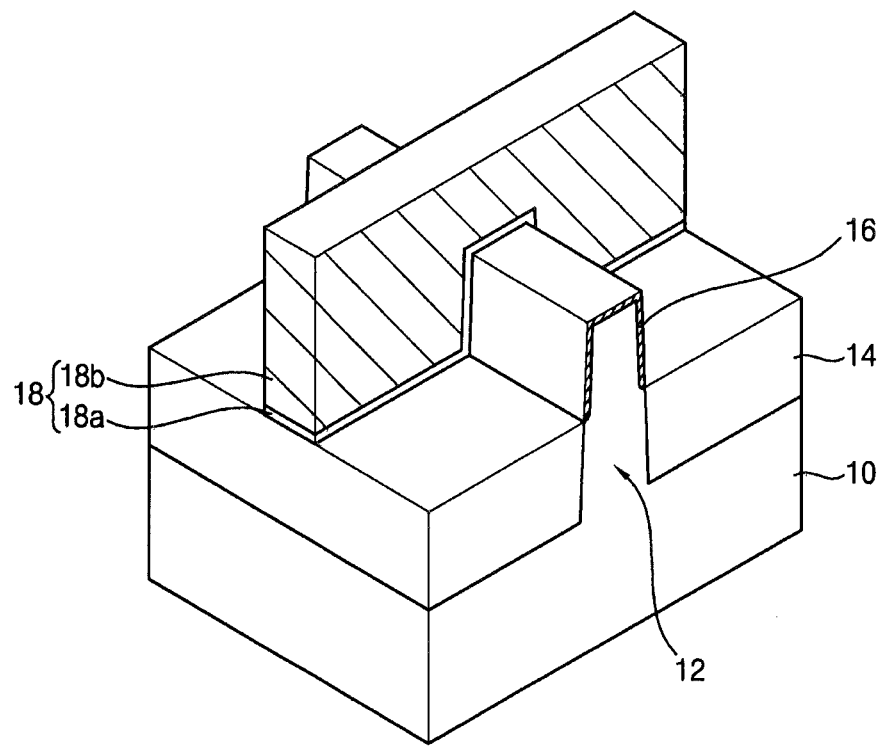
Figure 3B:
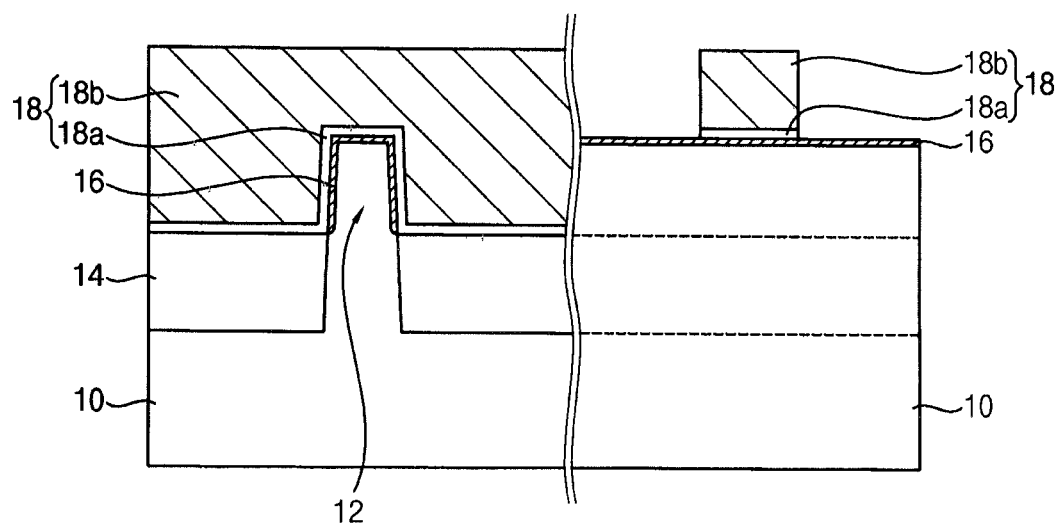

Referring to FIGS. 3A and 3B, a gate structure 18 may be formed on the resulting structure of the substrate 10.

Particularly, in some embodiments, a gate insulation layer, a gate electrode layer and a mask layer (not shown) may be sequentially formed on the substrate 10. The mask layer may be patterned by a photolithography process to form a gate mask (not shown), and the gate electrode layer and the gate insulation layer may be etched using the gate mask as an etching mask to form the gate structure 18. The gate structure 18 may include a gate insulation layer pattern 18a and a gate electrode 18b sequentially stacked on the substrate 10. In example embodiments, the gate mask may be removed. Alternatively, portions of the gate mask may remain on the gate electrode 18b, so that the gate structure 18 may include the gate insulation layer pattern 18a, the gate electrode 18b and the gate mask sequentially stacked on the substrate 10.

In some embodiments, the gate insulation layer used to form the gate insulation layer pattern 18a may be formed to include an oxide, e.g., silicon oxide, the gate electrode layer may be formed to include, e.g., polysilicon, and the mask layer may be formed to include a nitride, e.g., silicon nitride. In some embodiments, the gate insulation layer may be formed by a chemical vapor deposition (CVD) process, an atomic layer deposition (ALD) process, etc. Alternatively, in some embodiments, the gate insulation layer may be formed by a thermal oxidation process on an upper portion of the substrate 10. The gate electrode layer and the gate mask layer may be also formed by a CVD process, an ALD process, etc.

Figure 4A:
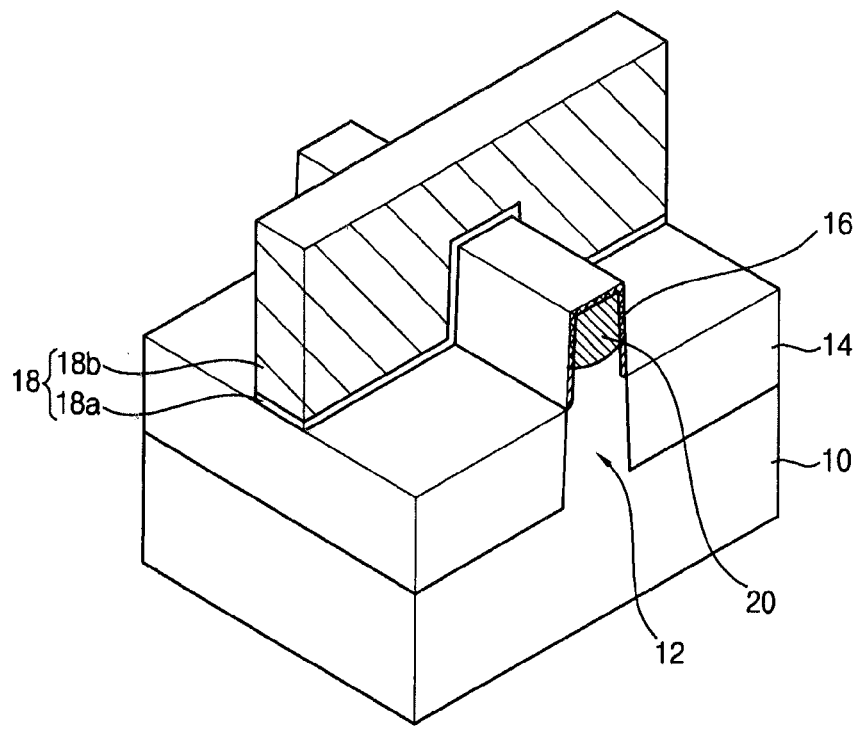
Figure 4B:
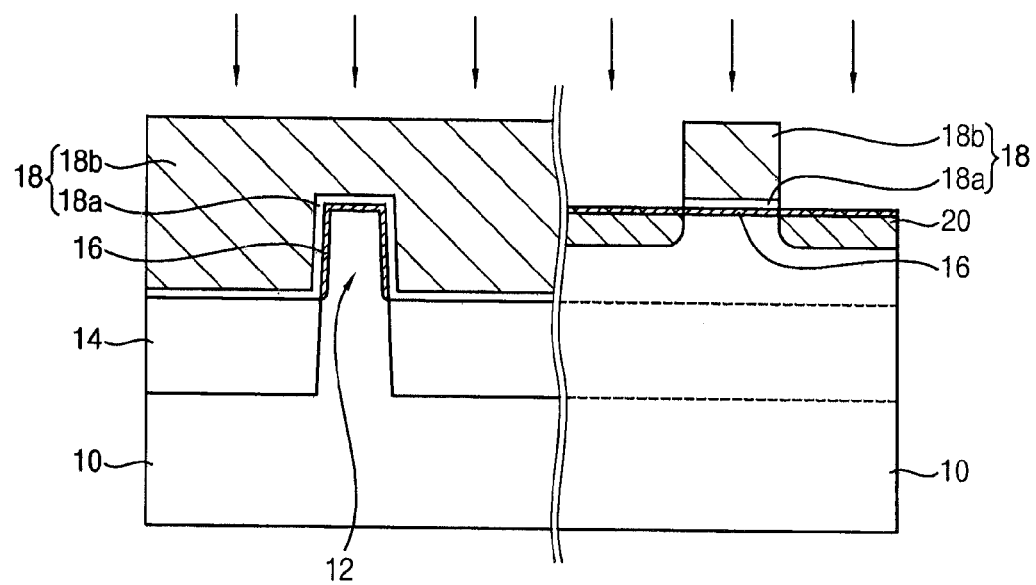

Referring to FIGS. 4A and 4B, impurities may be doped onto the substrate 10, for example using an ion implantation process to form source and drain regions 20 at upper portions of the active fin 12 adjacent to the gate structure 18. A spacer may be formed on a sidewall of the gate structure 18, and impurities may be further doped onto the substrate 10 to form the source and drain regions 20.

In example embodiments, the fixed charge region 16 may be formed on the entire surface of the active fin 12, that is, on the then-exposed surface of the active fin 12 that lies above the insulation layer 14. By the above processes, the semiconductor device may be manufactured to include the transistor having a target threshold voltage.

Figure 5:
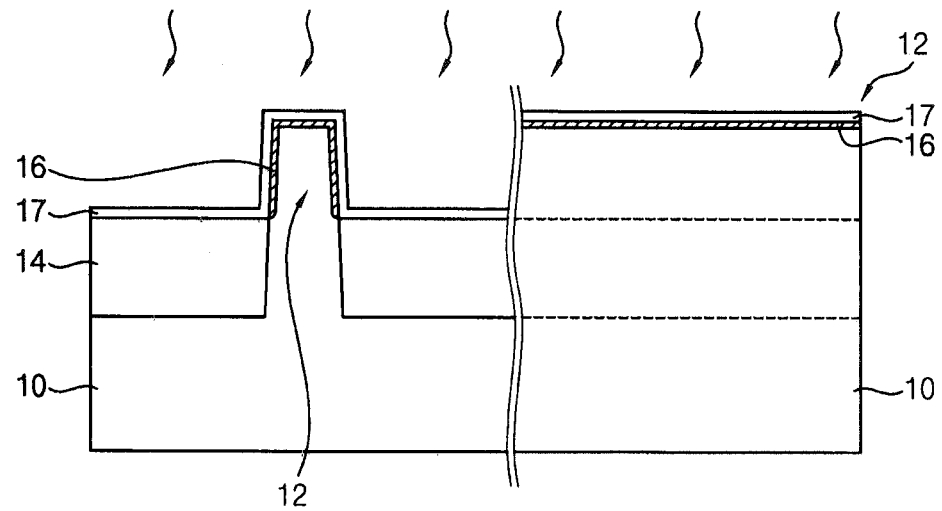
Figure 6:
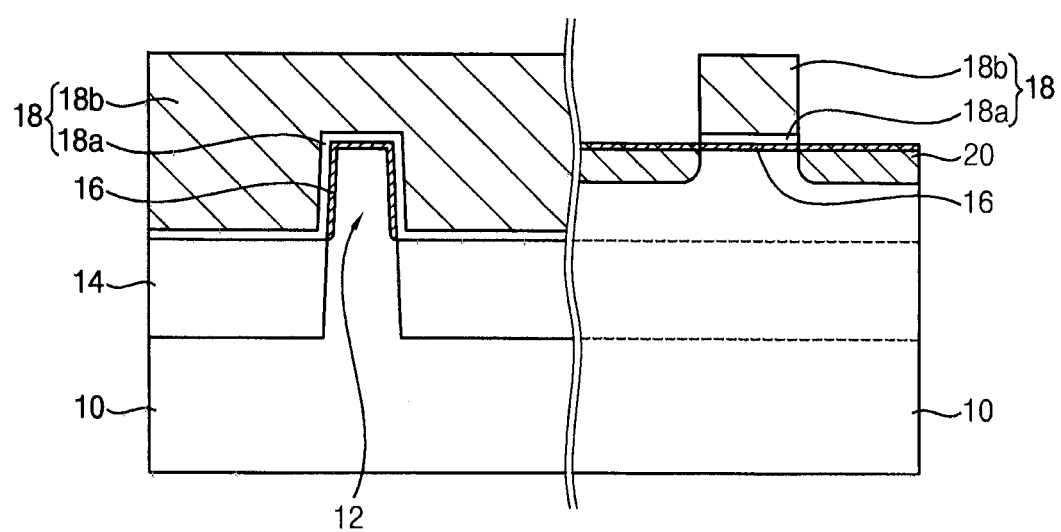

FIGS. 5 and 6 are cross-sectional views illustrating stages of a method of manufacturing a semiconductor device in accordance with example embodiments.

In the present embodiment, a process substantially the same as or similar to that illustrated with reference to FIGS. 1A and 1B may be performed to form the isolation layer 14 and the active fin 12 on the substrate 10.

Referring to FIG. 5, a gate insulation layer 17 may be formed on the isolation layer 14 and the active fin 12 of the substrate 10. A plasma annealing process may be performed while supplying a threshold voltage control gas onto the gate insulation layer 17 on the substrate 10. The plasma annealing process may otherwise be substantially the same as or similar to that described herein.

As described herein, in the plasma annealing process, the threshold voltage control gas may be trapped and/or detrapped by/from a surface of the active fin 12 through the gate insulation layer 17. Thus, a fixed charge region 16 including a fixed charge may be formed at the surface of the substrate 10 below the gate insulation layer. Particularly, the fixed charge region 16 may be formed at a channel region, and source and drain regions of a transistor.

Referring to FIG. 6, in some embodiments, a gate electrode layer and a mask layer (not shown) may be formed on the gate insulation layer 17. The mask layer may be patterned by a photolithography process to form a gate mask (not shown), and the gate electrode layer and the gate insulation layer 17 may be etched using the gate mask as an etching mask to form a gate structure 18. As a result, a gate structure 18 including a gate insulation layer pattern 18a and a gate electrode 18b sequentially stacked on the substrate 10 may be formed.

Impurities may be doped onto the substrate 10 by an ion implantation process to form source and drain regions 20 at the active fin 12 adjacent to the gate structure 18.

In accordance with the processes described herein, the semiconductor device may be manufactured to include the transistor having a target threshold voltage.

Figure 7:
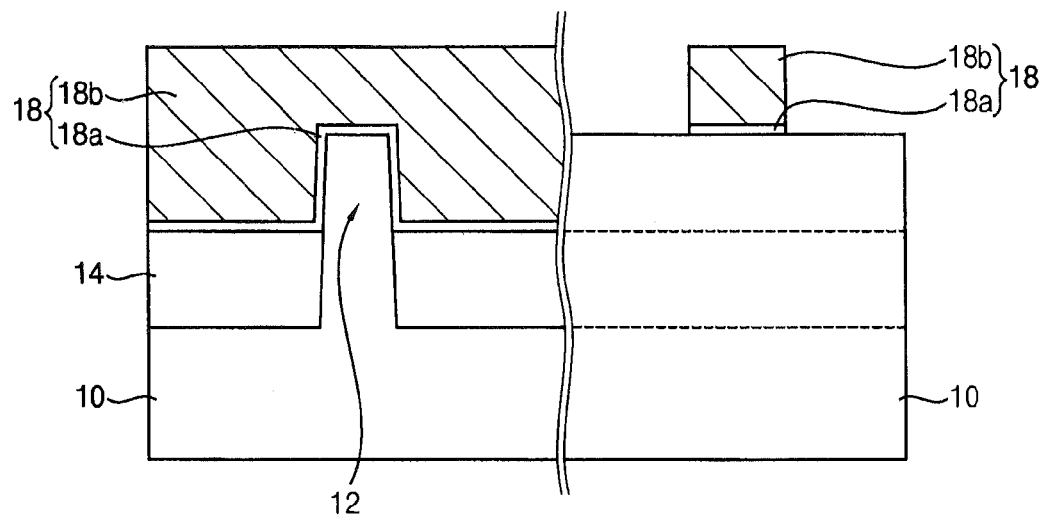
Figure 8:
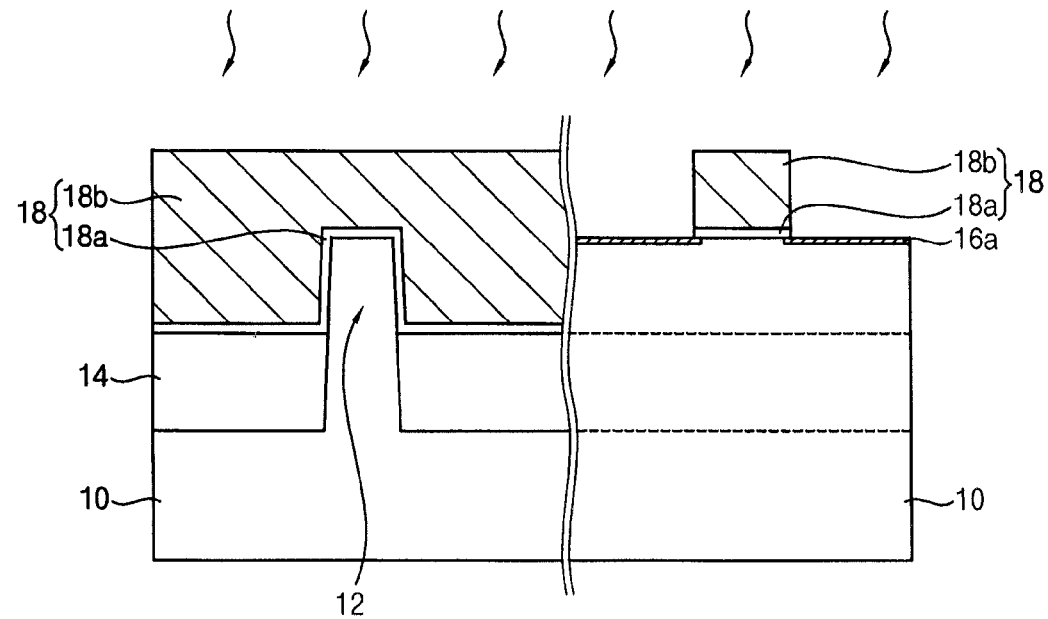
Figure 9:
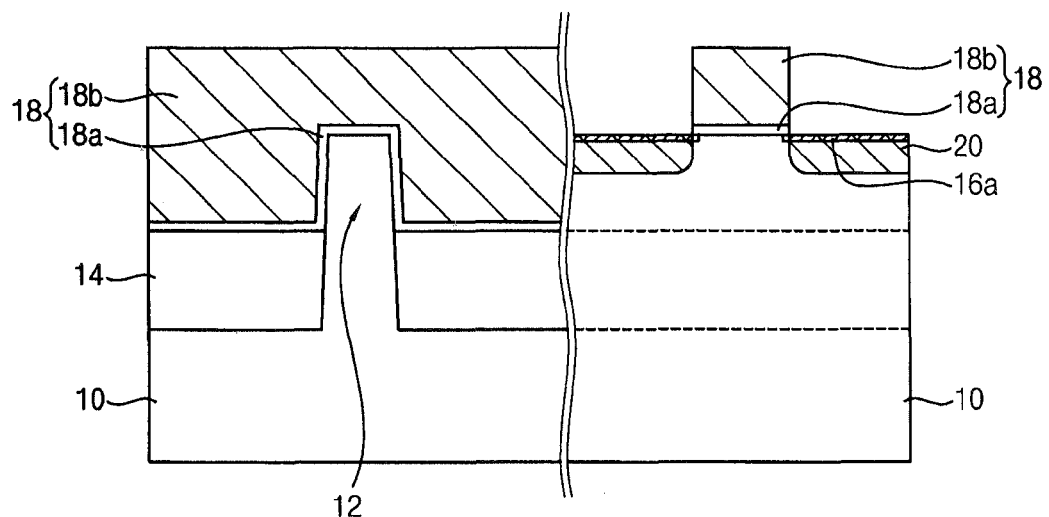

FIGS. 7 to 9 are cross-sectional views illustrating stages of a method of manufacturing a semiconductor device in accordance with example embodiments.

In the present embodiment, a process substantially the same as or similar to that illustrated with reference to FIGS. 1A and 1B may be performed to form the isolation layer 14 and the active fin 12 on the substrate 10.

Referring to FIG. 7, a gate structure 18 may be formed on the isolation layer 14 and the active fin 12 of the substrate 10. In some embodiments, the gate structure 18 may be formed by substantially the same process as that illustrated with reference to FIGS. 3A and 3B, FIG. 6, or by other suitable approaches.

Referring to FIG. 8, a plasma annealing may be performed while supplying a threshold voltage control gas onto the gate structure 18 and the substrate 10, so that a fixed charge region 16a is formed at a surface of the substrate 10.

In the plasma annealing, the threshold voltage control gas may be trapped and/or detrapped by/from source and drain regions 20 (refer to FIG. 9) of the active fin 12. Also, the threshold voltage control gas may penetrate along an interface of bonding structures, and thus may be trapped and/or detrapped by/from a portion of a channel region between the source and drain regions 20 of the active fin 12 that lies at edges of the channel region below the date structure 18, as shown. That is, the fixed charge region 16a may be formed at the source and drain regions 20 and an edge portion of the channel region.

In example embodiments, although the plasma annealing may be performed while supplying a threshold voltage control gas onto the source and drain regions 20 of the active fin 12, the threshold voltage of a transistor on the active fin 12 may be controlled by the threshold voltage control gas penetrating into the channel region. Particularly, when the transistor has a short channel region, the resulting threshold voltage of the transistor may be finely controlled.

Referring to FIG. 9, impurities may be doped onto the substrate 10 by an ion implantation process to form the source and drain regions 20 at the active fin 12 adjacent to the gate structure 18.

By the above processes, the semiconductor device may be manufactured to include the transistor having a target threshold voltage.

FIGS. 10 to 14 are cross-sectional views illustrating stages of a method of manufacturing a semiconductor device in accordance with example embodiments.

In the present embodiment, a process substantially the same as or similar to that illustrated with reference to FIGS. 1A and 1B may be performed to form the isolation layer 14 and the active fin 12 on the substrate 10.

Figure 10:
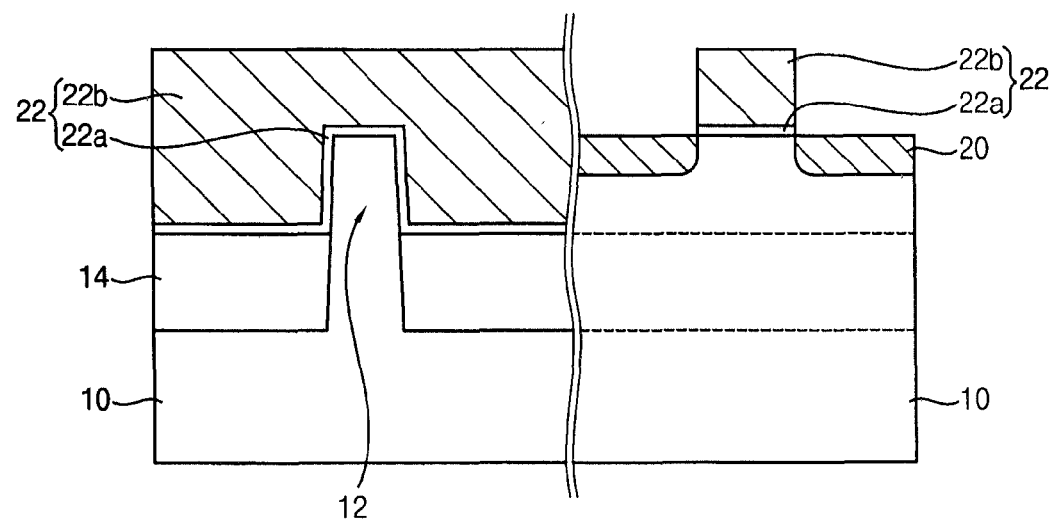

Referring to FIG. 10, a dummy gate structure 22 may be formed on the isolation layer 14 and the active fin 12 of the substrate 10. The dummy gate structure is referred to as a "dummy" herein in the sense that it is to serve as a sacrificial structure in further processes described herein.

Particularly, in some embodiments, the dummy gate structure 22 may be formed by sequentially stacking a dummy gate insulation layer, a dummy gate electrode layer and a gate mask layer (not shown), patterning the gate mask layer by a photolithography process using a photoresist pattern (not shown) to form a gate mask (not shown), and patterning the dummy gate electrode layer and the dummy gate insulation layer using the gate mask as an etching mask. Thus, the dummy gate structure 22 may be formed to include a dummy gate insulation layer pattern 22a and a dummy gate electrode 22b sequentially stacked on the isolation layer 14 and the active fin 12 of the substrate 10. In example embodiments, the gate mask may be removed. Alternatively, the gate mask may remain on the dummy gate electrode 22b, so that the dummy gate structure 22 may include the dummy gate insulation layer pattern 22a, the dummy gate electrode 22b and the gate mask sequentially stacked on the substrate 10. The dummy gate structure 22 may be formed by performing a process substantially the same as or similar to that illustrated with reference to FIGS. 3A and 3B.

Impurities may be doped onto the substrate 10 by an ion implantation process to form source and drain regions 20 at upper portions of the active fin 12 adjacent to the dummy gate structure 22.

Figure 11:
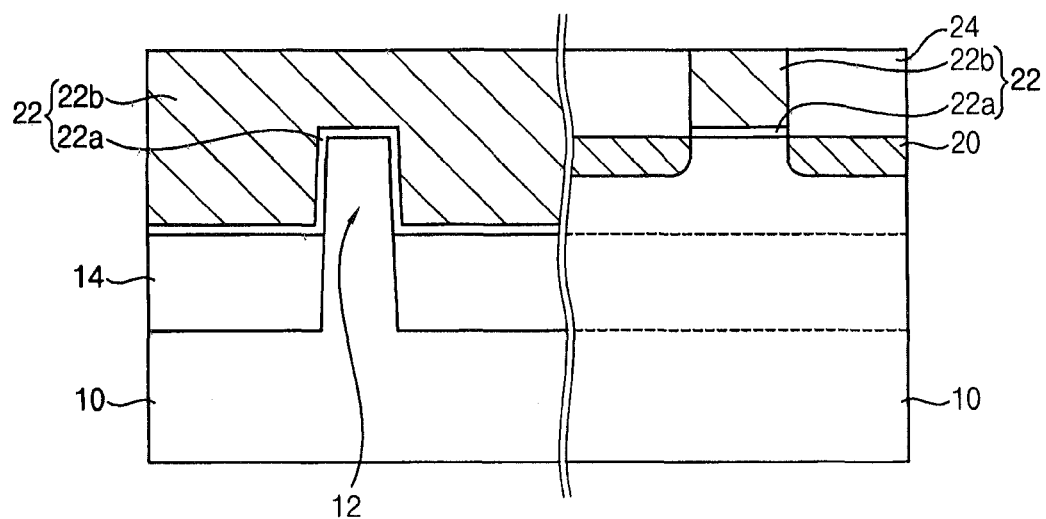

Referring to FIG. 11, an insulating interlayer 24 covering the dummy gate structure 22 may be formed on the substrate 10, and the insulating interlayer 24 may be planarized until a top surface of the dummy gate structure 22 may be exposed. In example embodiments, the planarization process may be performed by a chemical mechanical polishing (CMP) process and/or an etch back process.

Figure 12:
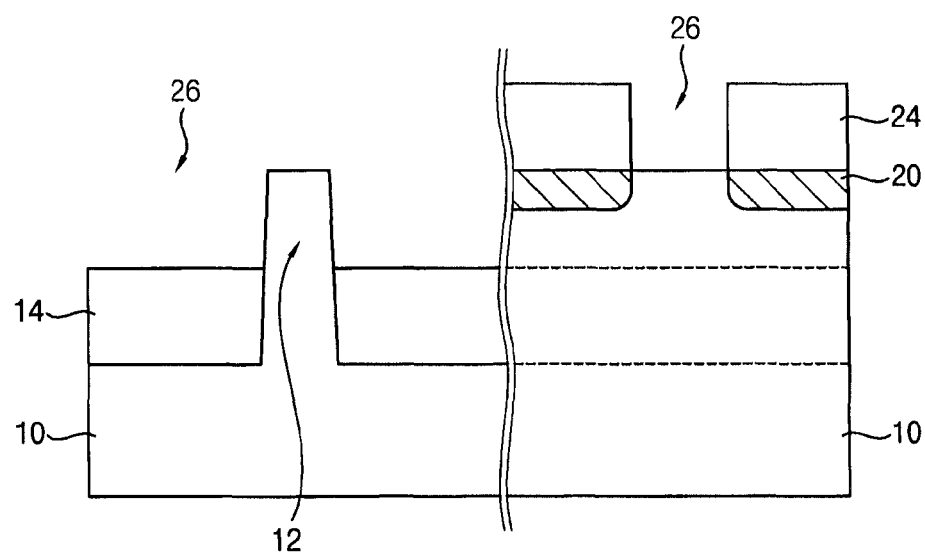

Referring to FIG. 12, the exposed dummy gate structure 22 may be selectively removed to form an opening 26.

In example embodiments, the dummy gate structure 22 may be removed so that the substrate 10 may be exposed by the opening 26. Alternatively, in some embodiments, only the dummy gate electrode 22b of the dummy gate structure 22 may be removed so that the dummy gate insulation layer pattern 22a may remain. A portion of the substrate 10 exposed by the opening 26 may serve as a channel region of a transistor.

Figure 13:
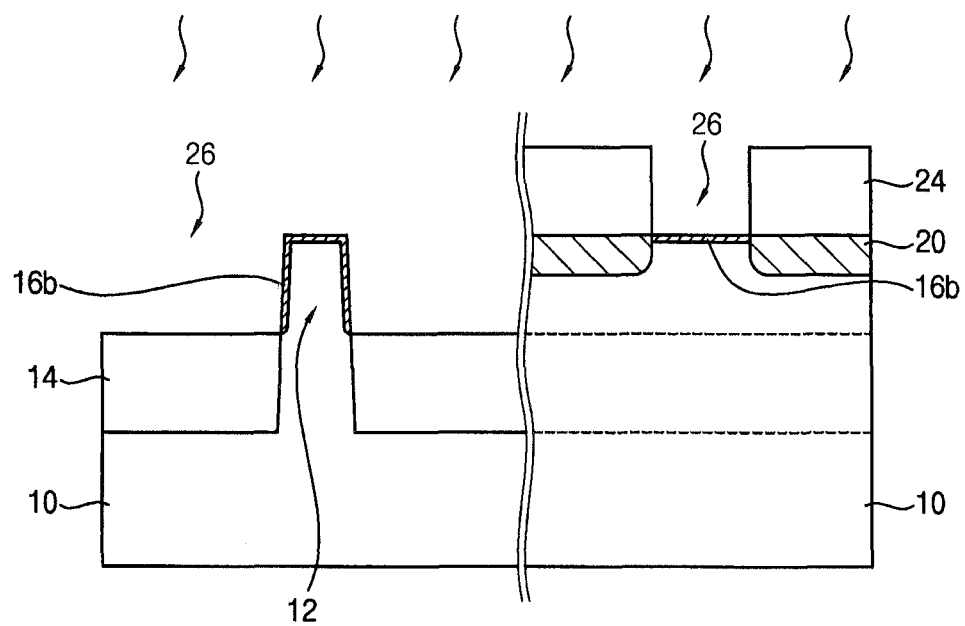

Referring to FIG. 13, a plasma annealing may be performed while supplying a threshold voltage control gas onto the substrate 10 through the opening 26.

In the plasma annealing, the threshold voltage control gas may be trapped and/or detrapped by/from the channel region of the substrate 10, so that a fixed charge region 16b may be formed at the channel region of the substrate 10. Thus, the threshold voltage of the transistor may be controlled by the fixed charge region 16b.

Figure 14:
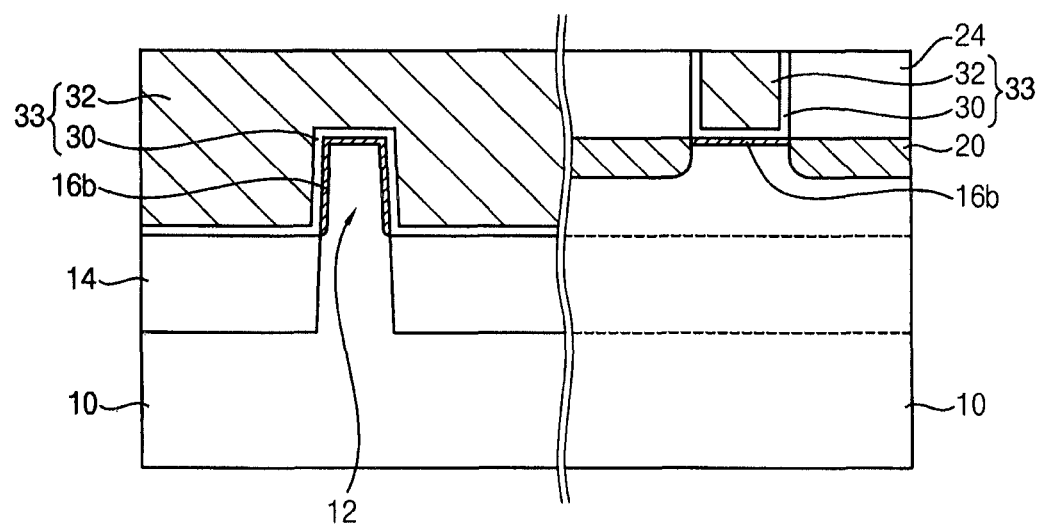

Referring to FIG. 14, a gate structure 33 including a high-k dielectric pattern 30 and a gate electrode 32 may be formed in the opening 26.

Particularly, a high-k dielectric layer may be formed on a bottom surface and a sidewall of the opening 26 and the insulating interlayer 24, and a gate electrode layer may be formed on the high-k dielectric layer to sufficiently fill the opening 26.

In some embodiments, the high-k dielectric layer may be formed to include a metal oxide having a high dielectric constant, e.g., hafnium oxide, tantalum oxide, zirconium oxide, or other suitable material. The gate electrode layer may be formed to include a material having a low resistance, e.g., a metal such as aluminum, copper, tantalum, etc., and/or a metal nitride, or other suitable material.

The gate electrode layer and the high-k dielectric layer may be planarized until a top surface of the insulating interlayer 24 may be exposed. Thus, the high-k dielectric layer pattern 30 and the gate electrode 32 may be formed in the opening 26. In example embodiments, the planarization process may be performed by a CMP process and/or an etch back process.

By the above processes, the semiconductor device may be manufactured to include the transistor having a target threshold voltage.

FIGS. 15A, 16A, 17A, 18A, 19A and 20A are perspective views illustrating stages of a method of manufacturing a semiconductor device in accordance with example embodiments. FIGS. 15B, 16B, 17B, 18B, 19B and 20B are cross-sectional views illustrating the stages of the method of manufacturing the semiconductor device in accordance with example embodiments.

Figure 15A:
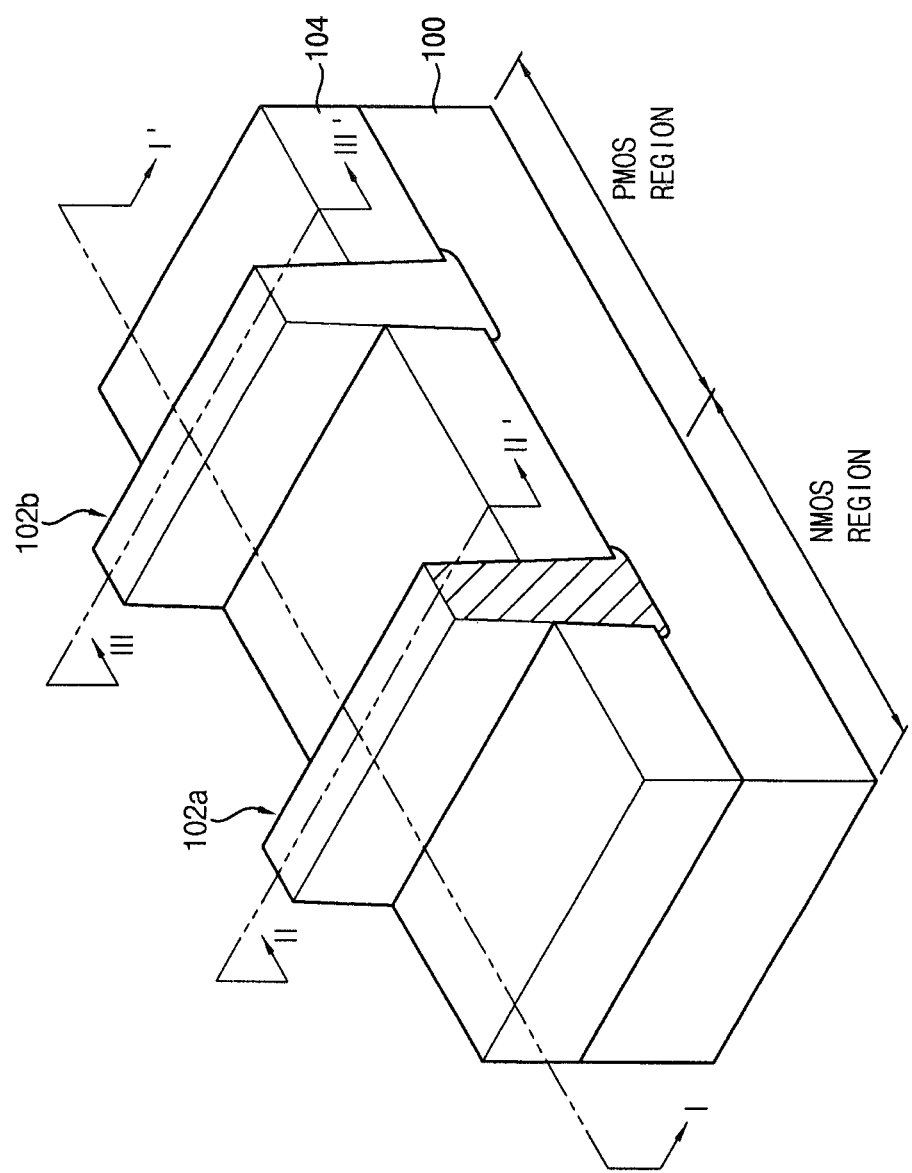

FIGS. 15B, 16B, 17B, 18B, 19B and 20B show cross-sectional views cut along a line I-I', a line II-II' and a line III-III' of FIG. 15A.

Figure 15B:
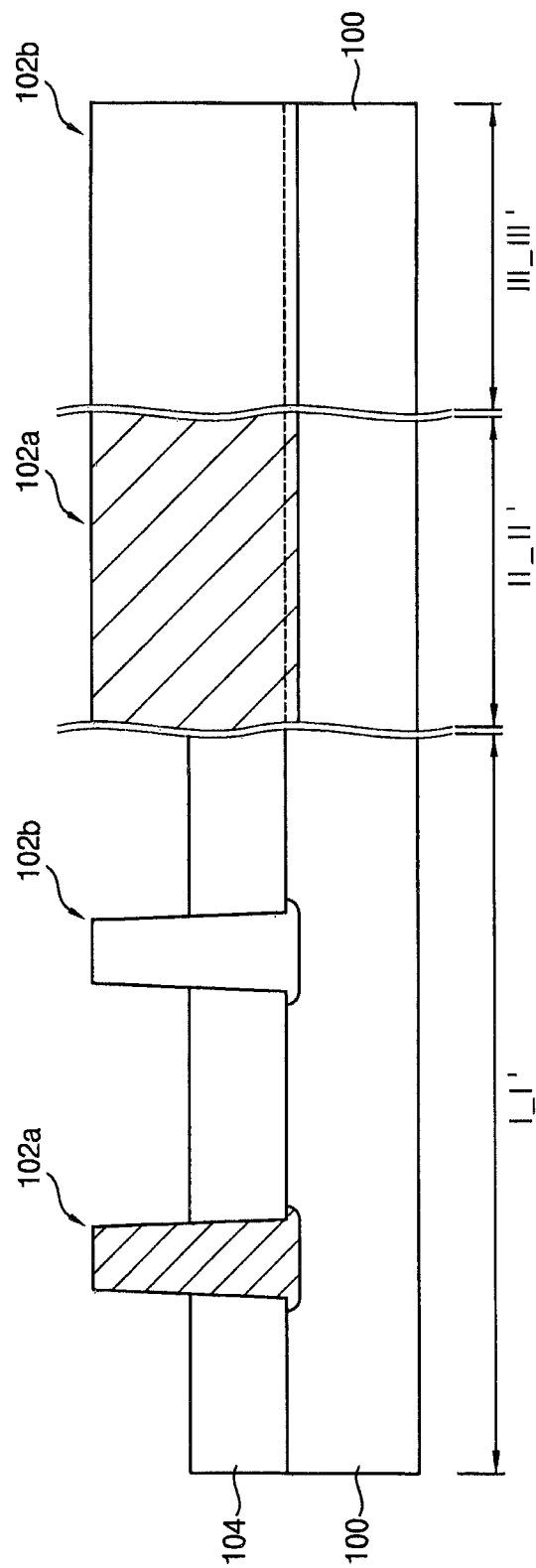

Referring to FIGS. 15A and 15B, a substrate 100 may be etched to form a first active fin 102a, a second active fin 102b and a trench (not shown) between the first and second active fins 102a and 102b. An isolation layer 104 may be formed in a lower portion of the trench. An NMOS transistor may be subsequently formed to correspond with the first active fin 102a and a PMOS transistor may be subsequently formed to correspond with the second active fin 102b.

An insulation layer (not shown) may be formed on the substrate 100 to fill the trench, and the insulation layer may be planarized until a top surface of the substrate 100 may be exposed. Also, an upper portion of the insulation layer may be removed to expose an upper sidewall of the trench, and thus the isolation layer 104 may be formed. The insulation layer may include an oxide, e.g., silicon oxide, or other suitable material In example embodiments, each of the first and second active fins 102a and 102b may extend in a first horizontal direction, and the first and second active fins 102a and 102b may be arranged in a second horizontal direction substantially perpendicular to the first direction.

P-type impurities may be doped onto the first active fin 102a to form a channel doping region of the NMOS transistor. Also, n-type impurities may be doped onto the second active fin 102b to form a channel doping region of the PMOS transistor.

Figure 16B:
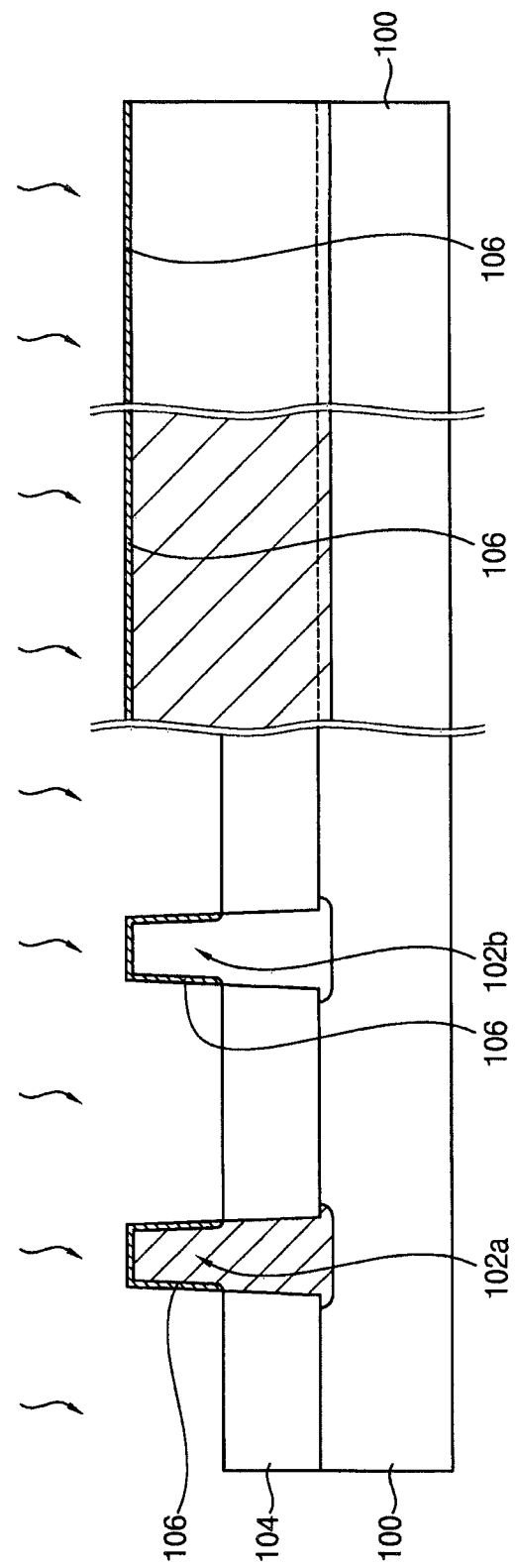

Referring to FIGS. 16A and 16B, a plasma annealing may be performed while supplying a threshold voltage control gas onto the substrate 100. By the plasma annealing, fixed charge regions 106 including fixed charges for controlling the threshold voltage may be formed at surfaces of the first and second active fins 102a and 102b, respectively. That is, the fixed charge regions 106 may be formed at channel regions, and source and drain regions of the NMOS and PMOS transistor, respectively. Thus, the threshold voltages of the NMOS and PMOS transistors may be simultaneously controlled.

In some embodiments, the threshold voltage control gas may include a gas having an atomic number smaller than that of an element of the substrate 100. The threshold voltage control gas may include, e.g., H, $H_2$, $D_2$ (deuterium), He, C, F, etc.

In the plasma annealing, temperature and pressure may be optimized so that the threshold voltage control gas may penetrate into the substrate 100, and be trapped and/or detrapped thereby/therefrom. In an example embodiment, the plasma annealing may be performed at a temperature of about 400 C to about 600 C under a pressure of about 0.1 Torr to about 5 Torr.

By the plasma annealing, in some embodiments, the threshold voltage control gas may be trapped and/or detrapped by/from a sidewall and a top surface of the first and second active fins 102a and 102b.

When positive fixed charges are generated at the surfaces of the first and second active fins 102a and 102b, the NMQS and PMOS transistors subsequently formed on the first and second active fins 102a and 102b may have threshold voltages lower than those of NMOS and PMOS transistors formed on active fins 102a and 102b having no fixed charge, respectively. Alternatively, when the negative fixed charges are generated at the surface of the first and second active fins 102a and 102b, NMOS and PMOS transistors subsequently formed on the first and second active fins 102a and 102b may have threshold voltages higher than those of NMOS and PMOS transistors formed on active fins 102a and 102b having no fixed charge, respectively.

As illustrated herein, the threshold voltages of the NMOS and PMOS transistors may be varied according to conductivity types of the fixed charges of the first and second active fins 102a and 102b, respectively. Thus, a CMOS transistor including the NMOS and PMOS transistors may be readily formed.

Alternatively, in some embodiments, for example in a manner similar to the embodiment depicted in FIGS. 10-14, a dummy gate insulation layer (not shown) may first be formed on the substrate 100, and the plasma annealing may be performed while supplying a threshold voltage control gas onto dummy gate insulation layer and the substrate 100, as illustrated and described herein.

Figure 17A:
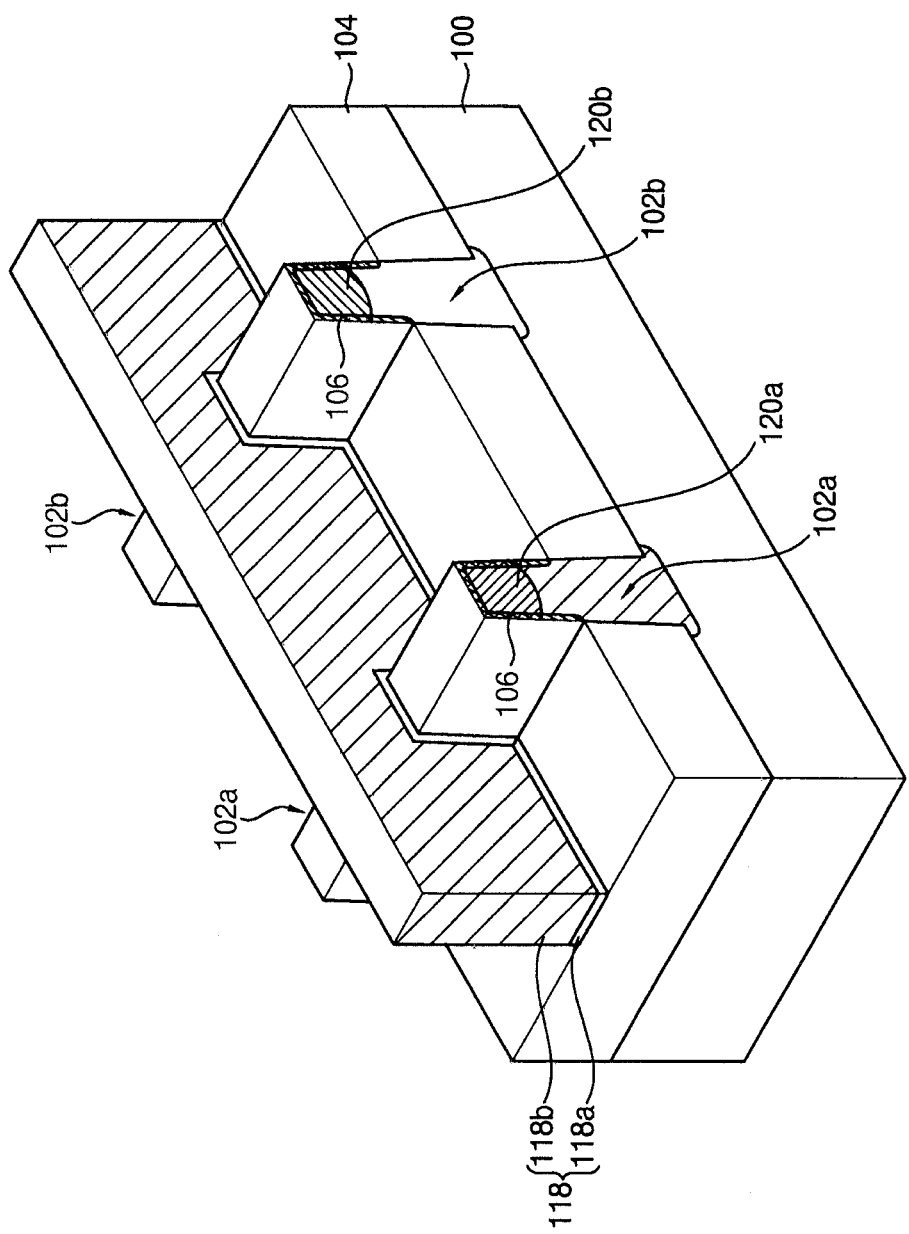

Referring to FIGS. 17A and 17B, in this embodiment, a dummy gate structure 118 may be formed on the substrate 100. The dummy gate structure 118 may be formed on the first and second active fins 102a and 102b, and may extend in the second direction.

Particularly, a dummy gate insulation layer, a dummy gate electrode layer and a gate mask layer (not shown) may be formed on the substrate 100. The gate mask layer may be patterned by a photolithography process using a photoresist pattern (not shown) to form a gate mask. The dummy gate electrode layer and the dummy gate insulation layer may be etched using the gate mask as an etching mask. Thus, the dummy gate structure 118 may be formed to include a dummy gate insulation layer pattern 118a and a dummy gate electrode 118b on the substrate 100. In example embodiments, the gate mask may be removed. Alternatively, the gate mask may remain on the dummy gate electrode 118b, so that dummy gate structure 118 may include the dummy gate insulation layer pattern 118a, the dummy gate electrode 118b and the gate mask sequentially stacked on the substrate 100.

In some embodiments, the dummy gate insulation layer may be formed to include an oxide, e.g., silicon oxide, the dummy gate electrode layer may be formed to include, e.g., polysilicon, and the mask layer may be formed to include a nitride, e.g., silicon nitride.

N-type impurities may be doped onto the first active fin 102a by an ion implantation process to form first source and drain regions 120a at upper portions of the first active fin 102a adjacent to the dummy gate structure 118. Also, p-type impurities may be doped onto the second active fin 102b by an ion implantation process to form second source and drain regions 120b at upper portions of the second active fin 102b adjacent to the dummy gate structure 118.

In some example embodiments, the dummy gate structure 118 may serve as an actual gate structure that may be operated. In this case, the NMOS and PMOS transistors may be formed on the first and second fins 102a and 102b by performing the processes illustrated with reference to FIGS. 15A, 15B, 16A, 16B, 17A and 17B.

Figure 18A:
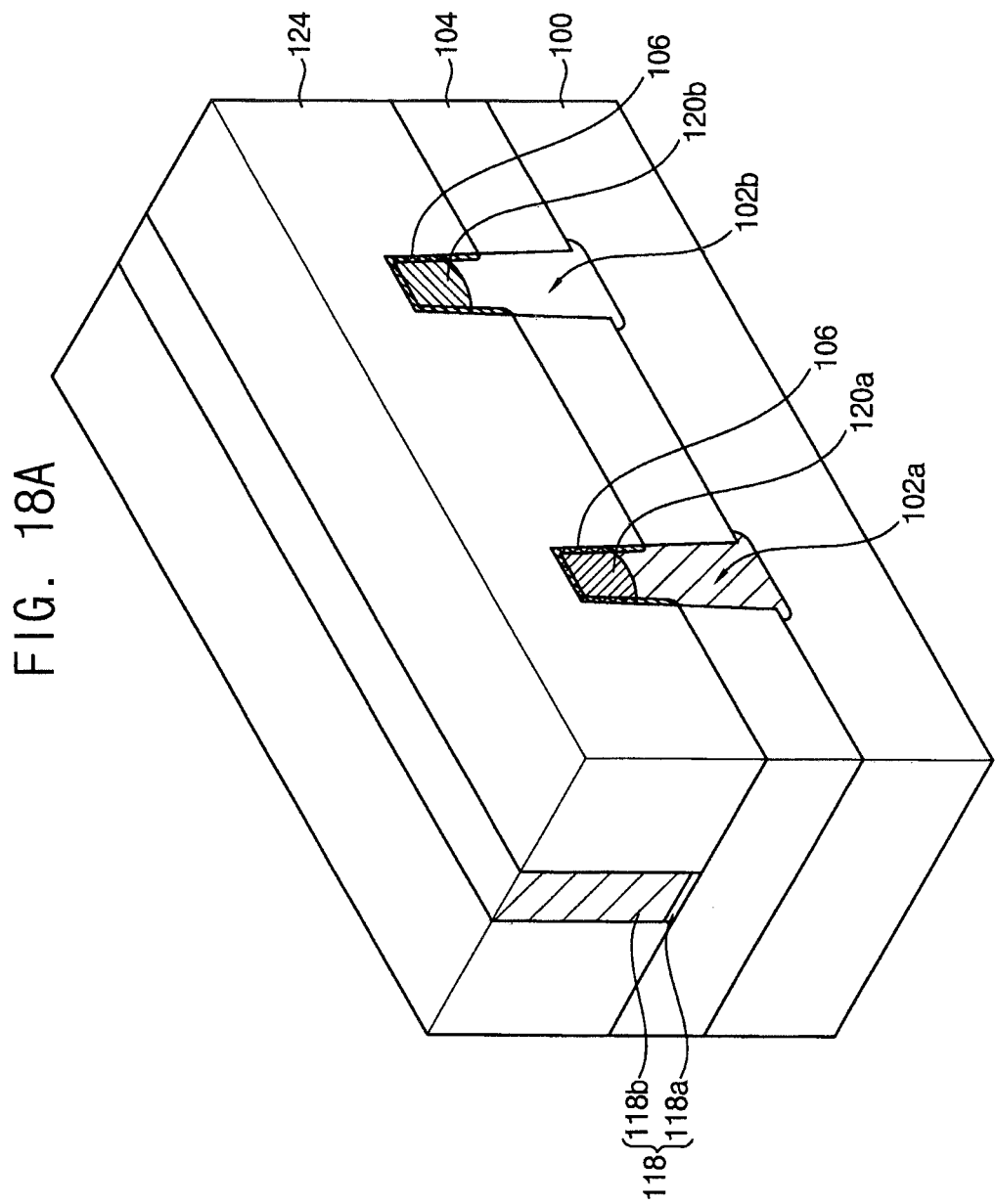
Figure 18B:
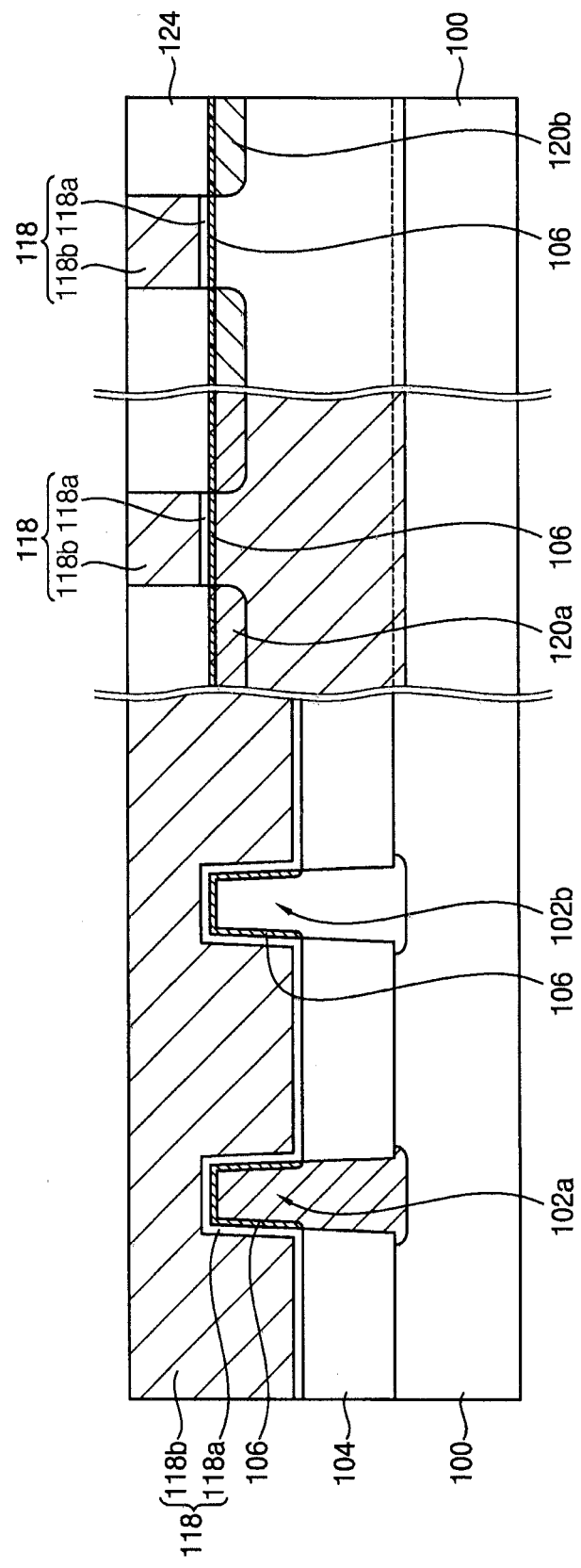

Referring to FIGS. 18A and 18B, an insulating interlayer 124 covering the dummy gate structure 118 may be formed on the substrate 100, and the insulating interlayer 124 may be planarized until a top surface of the dummy gate structure 118 may be exposed. In example embodiments, the planarization process may be performed by a CMP process and/or an etch back process.

Figure 19A:
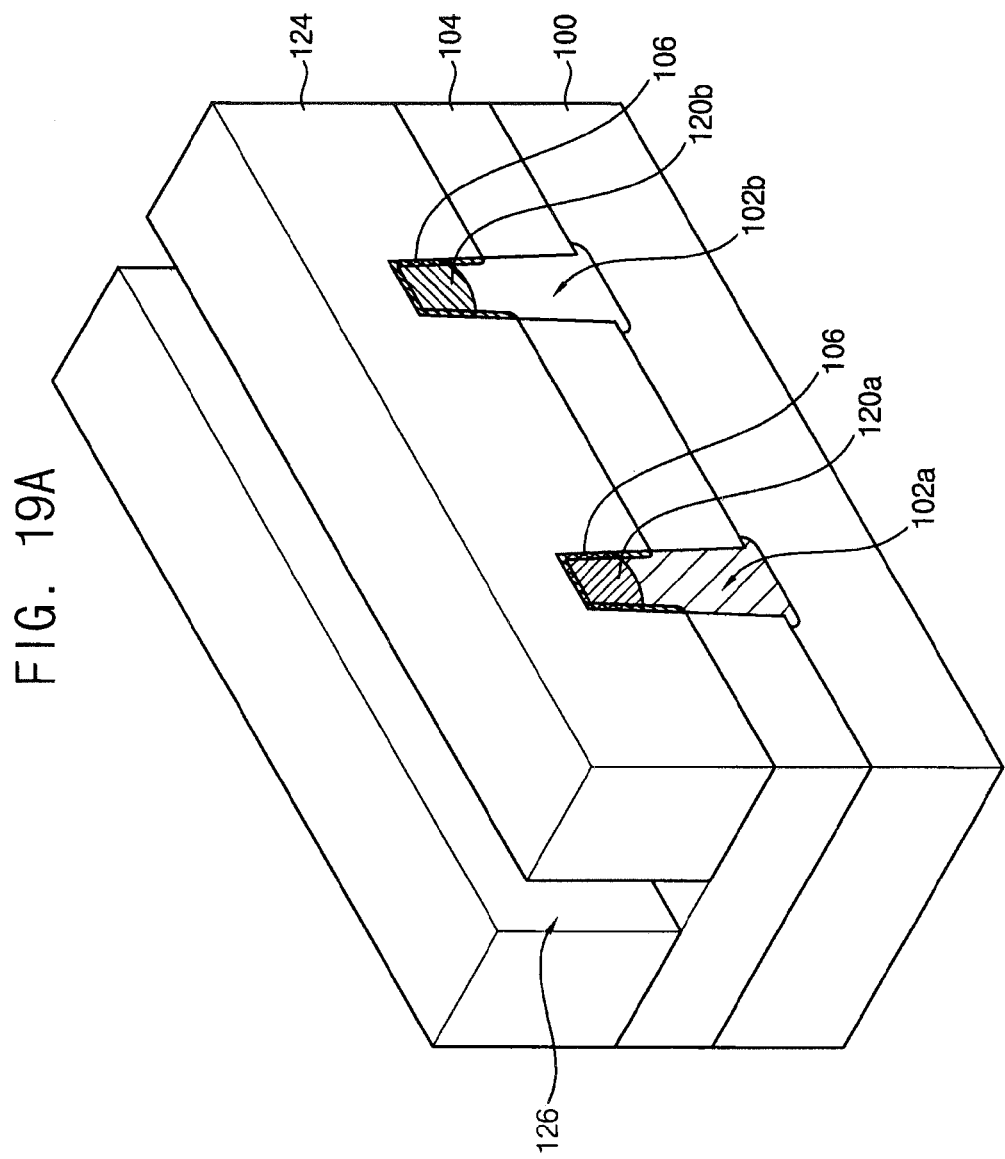
Figure 19B:
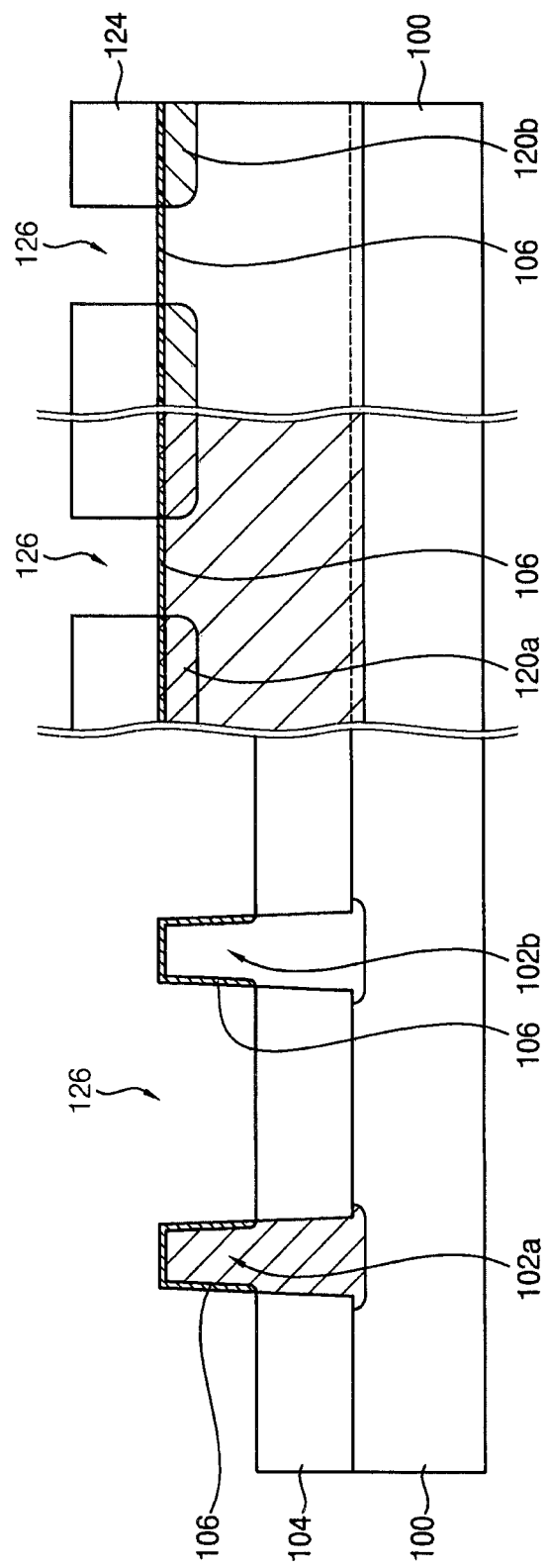

Referring to FIGS. 19A and 19B, the exposed dummy gate structure 118 may be removed to form an opening 126. A portion of the substrate 100 exposed by the opening 126 may serve as a channel region of a transistor.

Figure 20A:
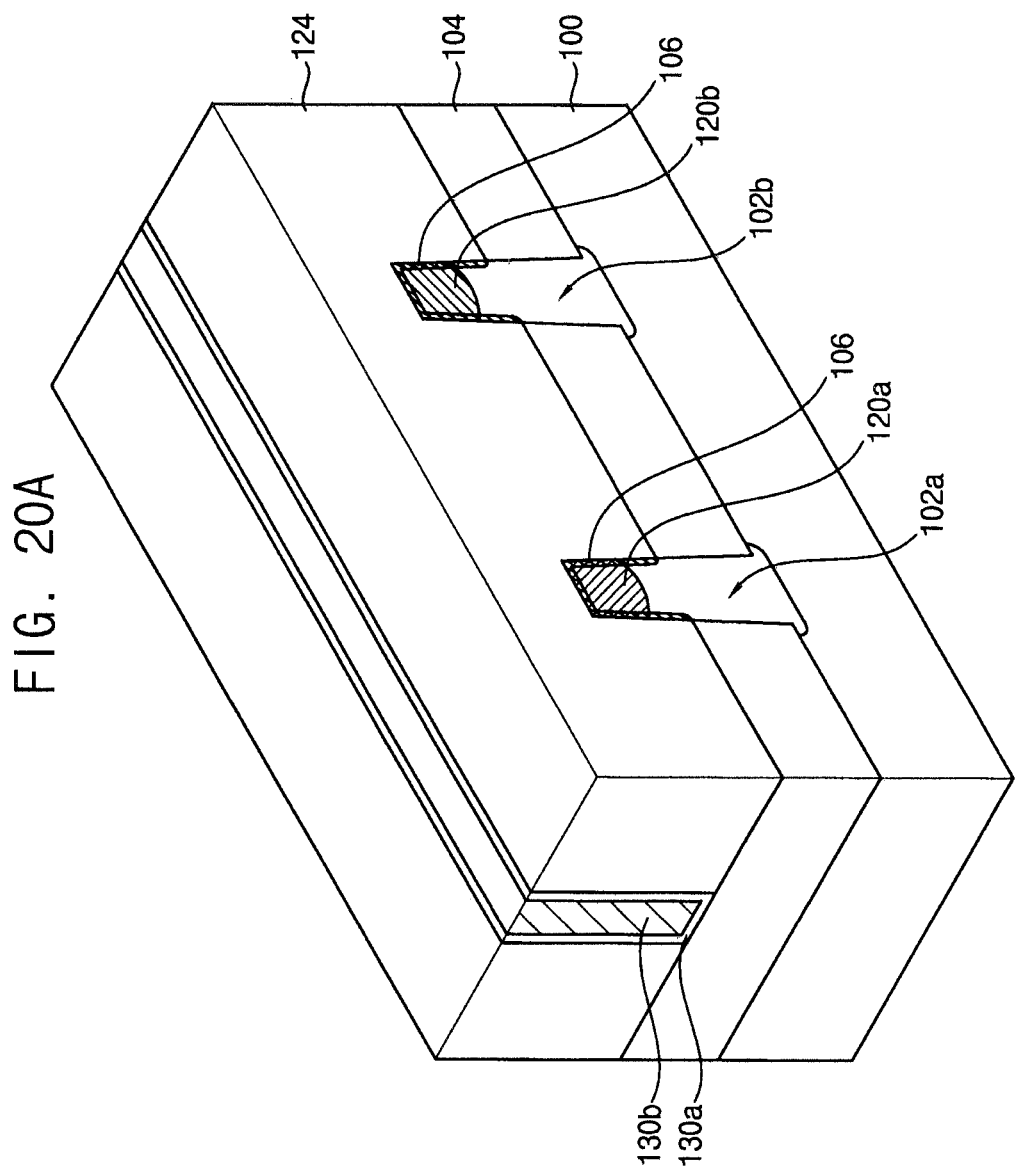
Figure 20B:
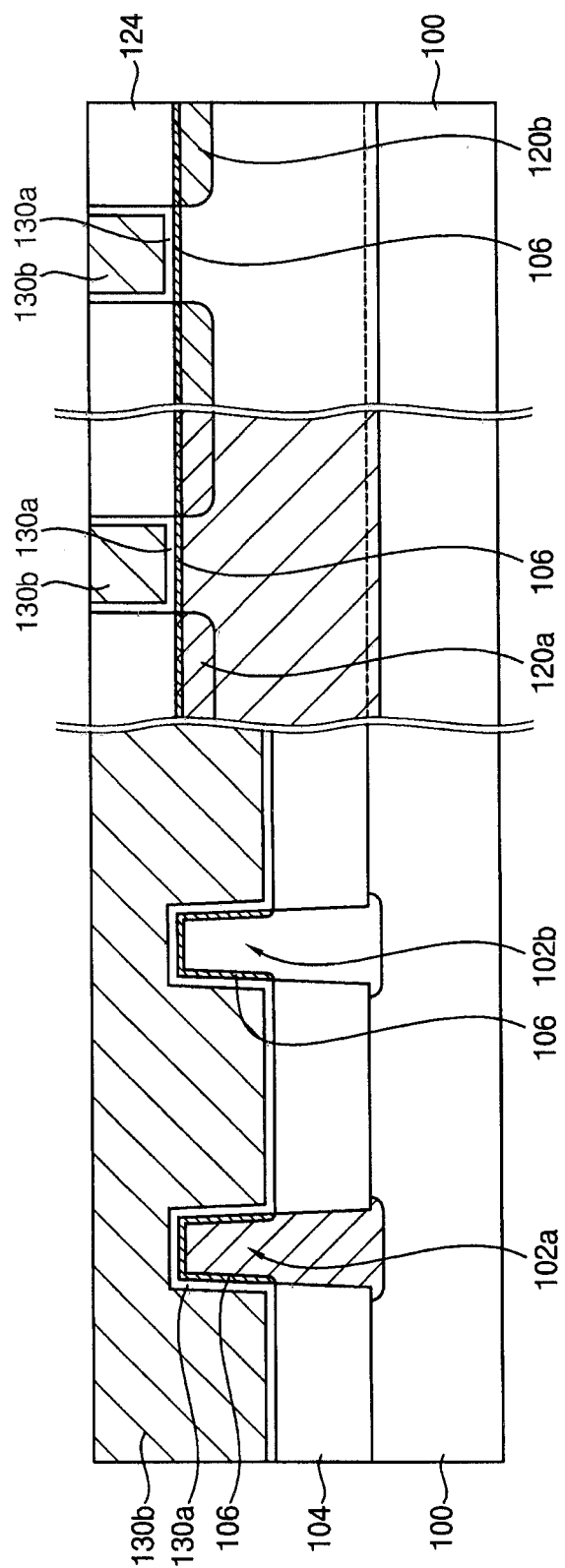

Referring to FIGS. 20A and 20B, a high-k dielectric layer may be formed on a bottom surface and a sidewall of the opening 126 and the insulating interlayer 124, and a gate electrode layer may be formed on the high-k dielectric layer to sufficiently fill the opening 126. The gate electrode layer and the high-k dielectric layer may be planarized until a top surface of the insulating interlayer 124 may be exposed. Thus, a high-k dielectric pattern 130a and a gate electrode 130b may be formed in the opening 126. In example embodiments, the planarization process may be performed by a CMP process and/or an etch back process. The gate electrode 130b may include a metal, or other suitable gate material.

In example embodiments, the fixed charge regions 106 may be formed at an entire surface of the first and second active fins 102a and 102b. By the above processes, a CMOS transistor including the NMOS and PMOS transistors and having a target threshold voltage may be manufactured.

FIGS. 21 to 24 are cross-sectional views illustrating stages of a method of manufacturing a semiconductor device in accordance with example embodiments.

In the present embodiment, a process substantially the same as or similar to that illustrated with reference to FIGS. 15A and 15B may be performed to form a structure, as shown in FIGS. 15A and 15B.

Figure 21:
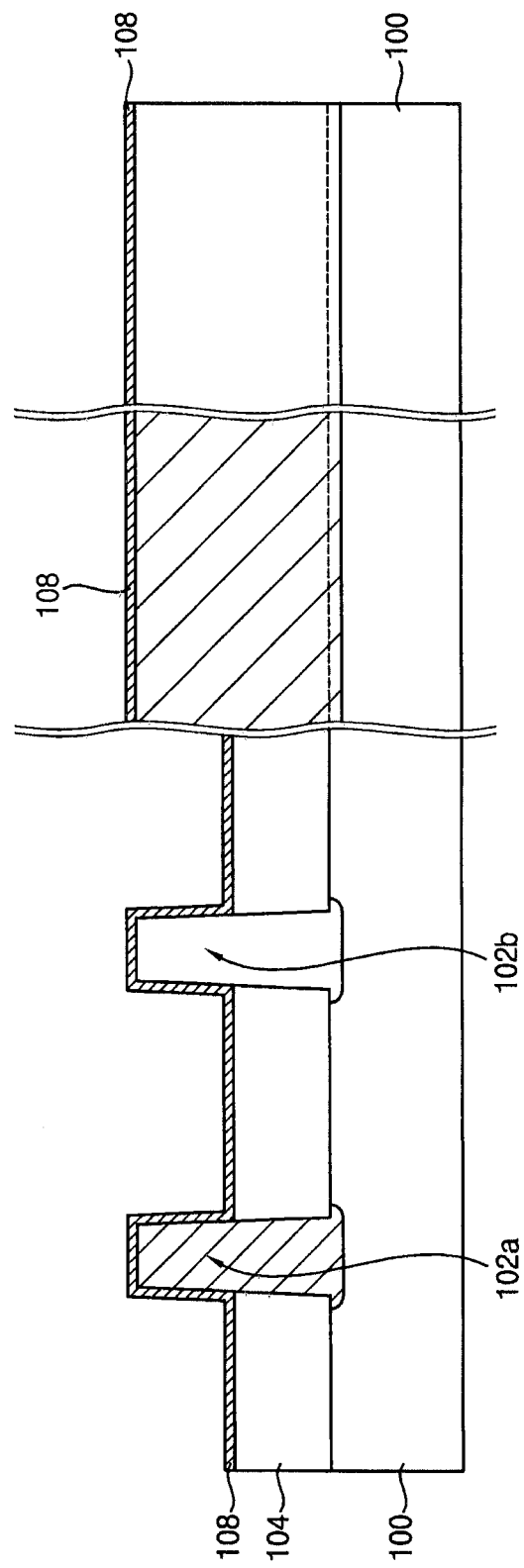

Referring to FIG. 21, a blocking layer 108 may be formed on the first and second active fins 102a and 102b and the isolation layer 104 of the substrate 100. The blocking layer 108 may prevent from a threshold voltage control gas from penetrating into the first and/or second active fins 102a and/or 102b. The blocking layer 108 may be formed to include, e.g., silicon oxide, silicon nitride, spin on hard mask, etc.

Figure 22:
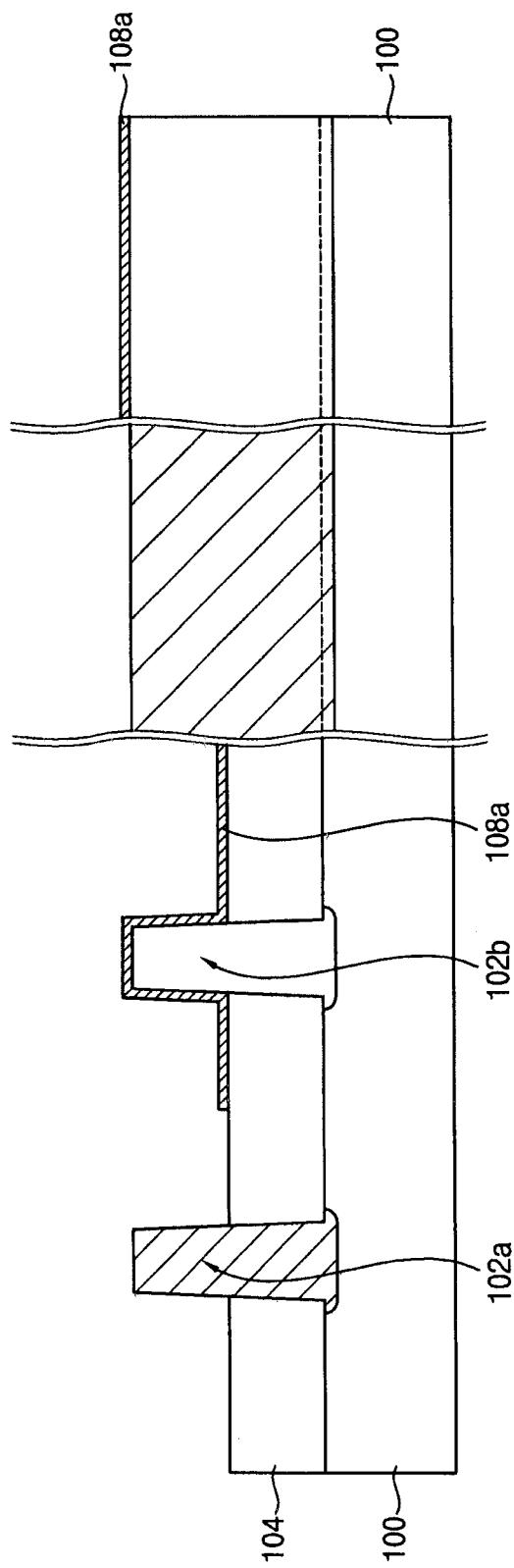

Referring to FIG. 22, the blocking layer 108 may be partially etched to form a blocking layer pattern 108a. The blocking layer pattern 108a may be formed to expose one of the active fins 102a and 102b on which a transistor, of which a threshold voltage needs to be controlled, may be formed. For example, when a threshold voltage of the NMOS transistor needs to be controlled, the blocking layer pattern 108a may be formed to cover the second active fin 102b and to expose the first active fin 102a, as shown in FIG. 22.

Figure 23:
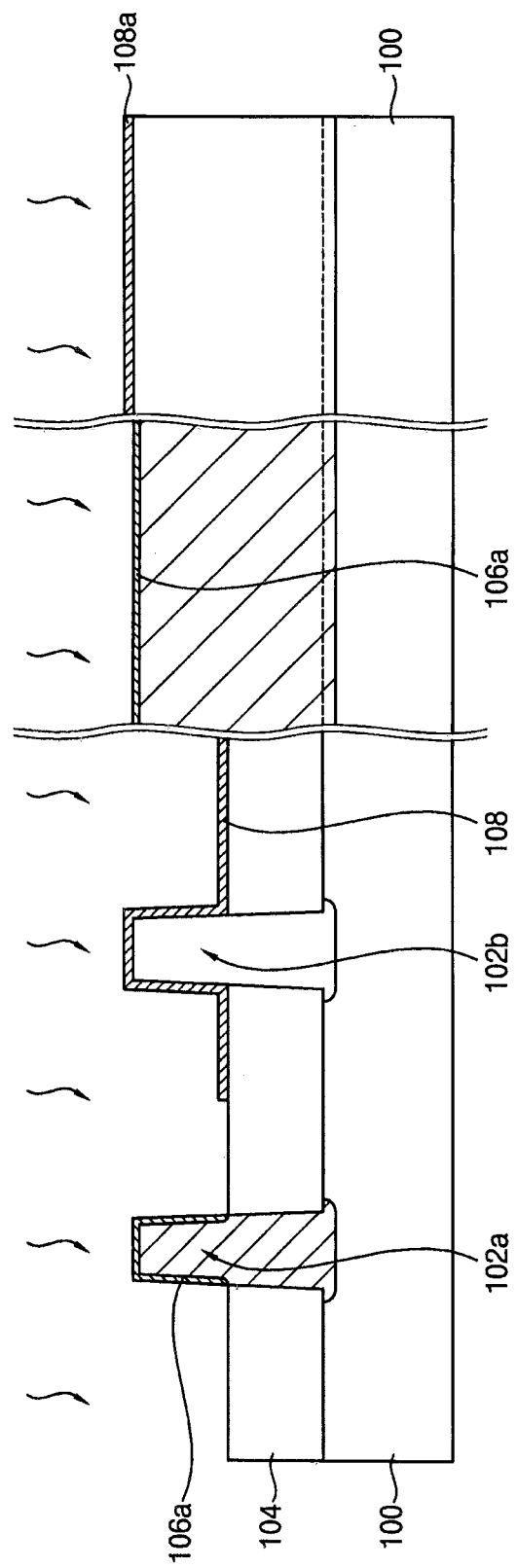

Referring to FIG. 23, a plasma annealing may be performed while supplying a threshold voltage control gas onto the substrate 100. The plasma annealing may be substantially the same as or similar to that illustrated with reference to FIGS. 16A and 16B, or other example embodiments described herein By the plasma annealing, a fixed charge region 106a may be formed at surfaces of the first active fin 102a by the threshold voltage control gas penetrating into the first active fin 102a. However, the fixed charge region 106a is not formed at a surface of the second active fin 102b, because the blocking layer pattern 108a prevents the threshold voltage control gas from penetrating into the second active fin 108b. Thus, the threshold voltage of the NMOS transistor formed on the first active fin 102a may be selectively controlled. After completion of the plasma annealing, the blocking layer pattern 108a may be removed.

Figure 24:
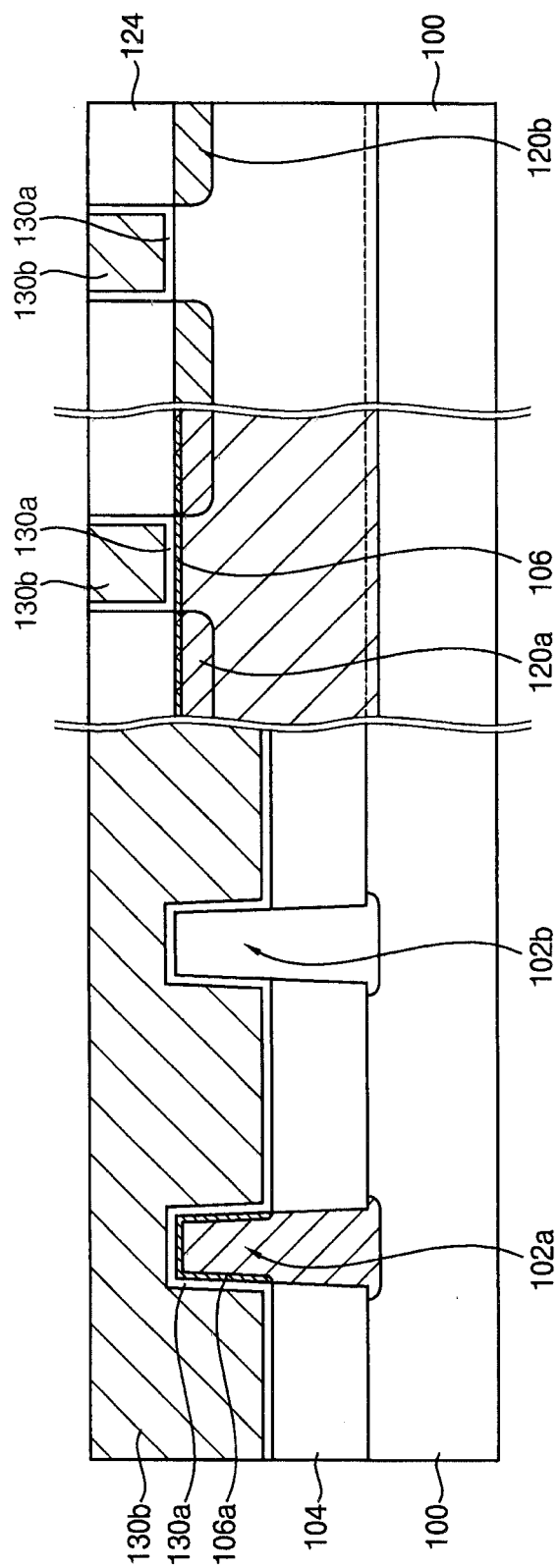

Then, processes substantially the same as or similar to those illustrated with reference to FIGS. 17A, 17B, 18A, 18B, 19A, 19B, 20A and 20B, or other embodiments, may be performed to form the semiconductor device, as shown in FIG. 24.

In the embodiments of FIGS. 21-24, the fixed charge region 106a may be formed only at one of the first and second active fin types 102a and 102b. Thus, a transistor of which a threshold voltage needs to be controlled may be selected, and then the fixed charge region 106a may be formed at a channel region of the selected transistor to control the threshold voltage. By the above processes, a CMOS transistor including NMOS and PMOS transistors and having a target threshold voltage may be manufactured.

Figure 25:
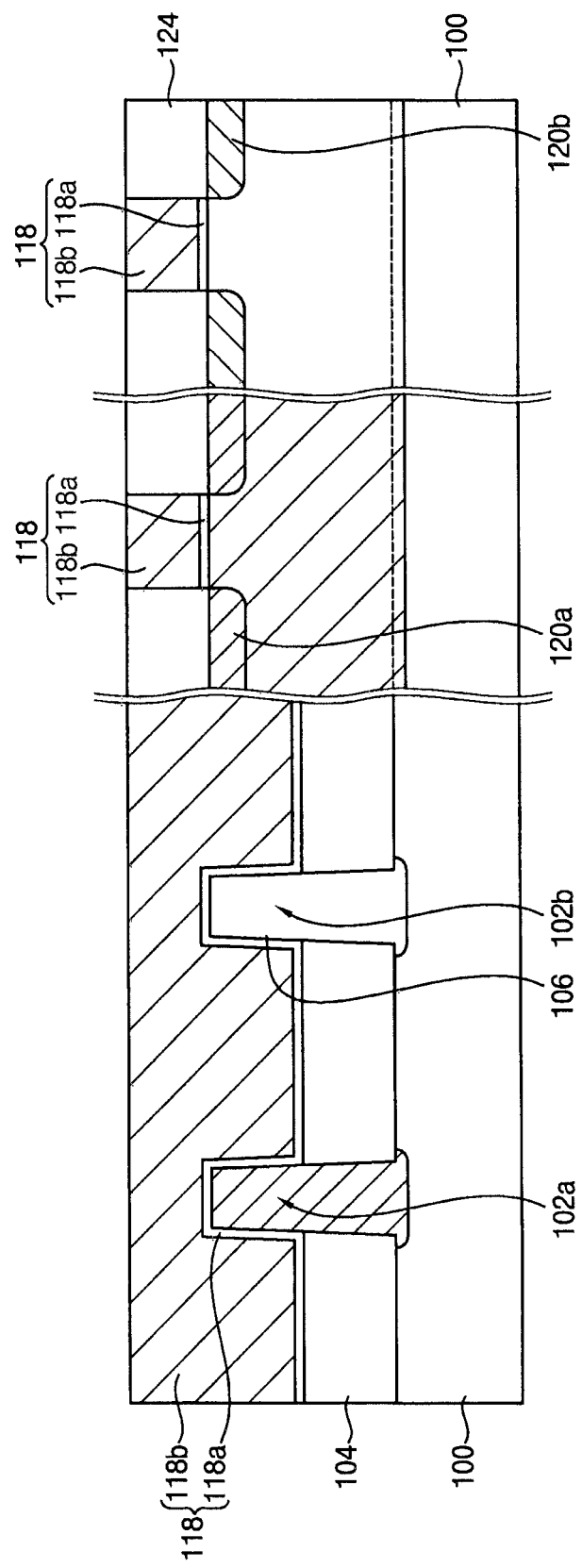
Figure 26:
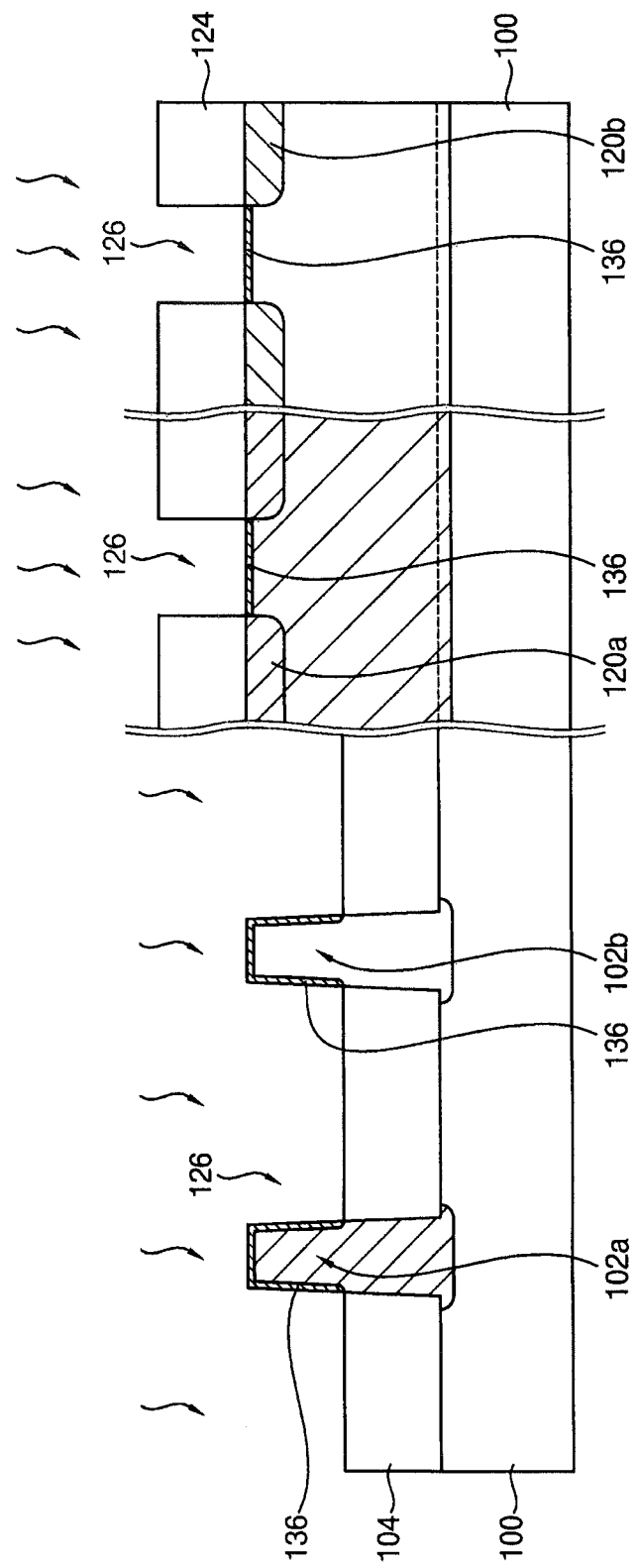
Figure 27:
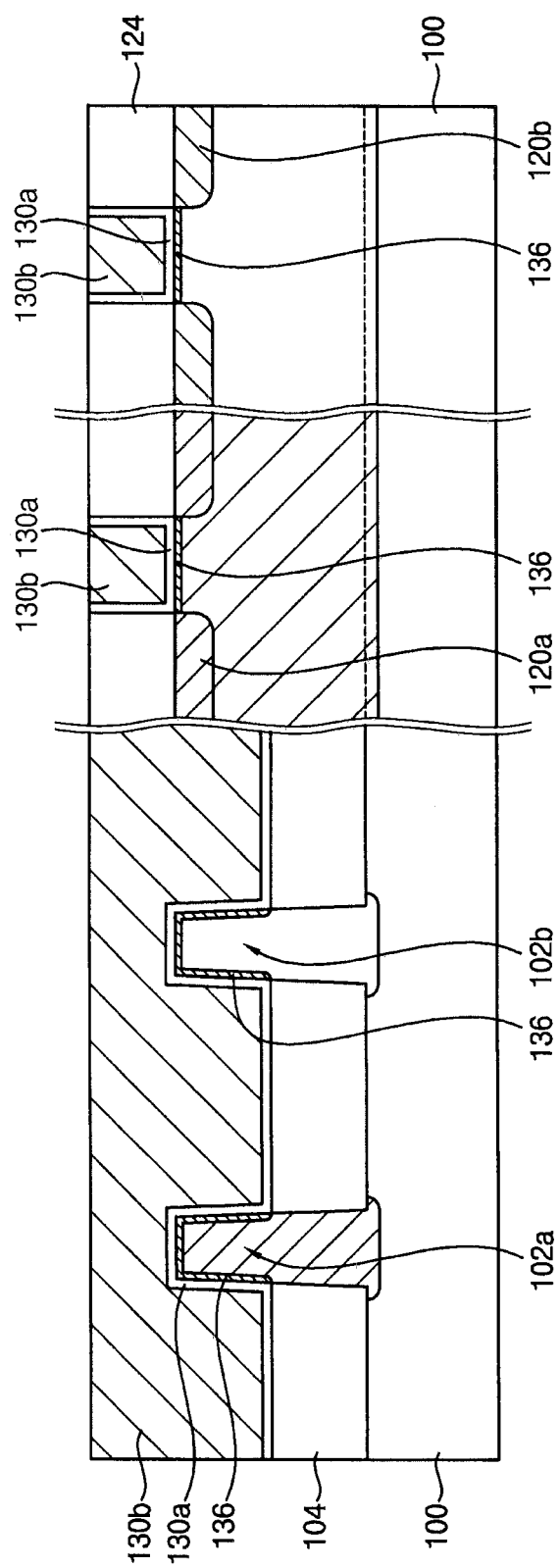

FIGS. 25 to 27 are cross-sectional views illustrating stages of a method of manufacturing a semiconductor device in accordance with example embodiments.

A process substantially the same as or similar to that illustrated with reference to FIGS. 15A and 15B may be performed to form a structure, as shown in FIGS. 15A and 15B.

Referring to FIG. 25, a dummy gate structure may be formed on the substrate 100. The dummy gate structure 118 may be formed on the first and second active fins 102a and 102b, and may extend in the second direction.

N-type impurities may be doped onto the first active fin 102a by an ion implantation process to form first source and drain regions 120a at upper portions of the first active fin 102a adjacent to the dummy gate structure 118. Also, p-type impurities may be doped onto the second active fin 102b by an ion implantation process to form second source and drain regions 120b at upper portions of the second active fin 102b adjacent to the dummy gate structure 118.

An insulating interlayer 124 covering the dummy gate structure 118 may be formed on the substrate 100, and the insulating interlayer 124 may be planarized until a top surface of the dummy gate structure 118 may be exposed. The above process may be substantially the same as or similar to those illustrated with reference to FIGS. 17A, 17B, 18A and 18B.

Referring to FIG. 26, the exposed dummy gate structure 118 may be removed to form an opening 126.

A plasma annealing may be performed while supplying a threshold voltage control gas onto the substrate 100 through the opening 126. In the plasma annealing, fixed charge regions 136 for controlling the threshold voltage may be formed at channel regions of the first and second active fins 102a and 102b, respectively. Thus, the threshold voltages of NMOS and PMOS transistors subsequently formed on the first and second active fins 102a and 102b may be simultaneously controlled. The plasma annealing may be performed under process conditions substantially the same as or similar to those illustrated with reference to FIGS. 16A and 16B.

Referring to FIG. 27, a high-k dielectric layer may be formed on a bottom surface and a sidewall of the opening 126 and the insulating interlayer 124, and a gate electrode layer may be formed on the high-k dielectric layer to sufficiently fill the opening 126. The gate electrode layer and the high-k dielectric layer may be planarized until a top surface of the insulating interlayer 124 may be exposed. Thus, a high-k dielectric pattern 130a and a gate electrode 130b may be formed in the opening 126. In example embodiments, the planarization process may be performed by a CMP process and/or an etch back process.

In example embodiments, the fixed charge regions 136 may be formed at the channel regions of the first and second active fins 102a and 102b, respectively. By the above processes, a CMOS transistor including the NMOS and PMOS transistors and having a target threshold voltage may be manufactured.

Figure 28:
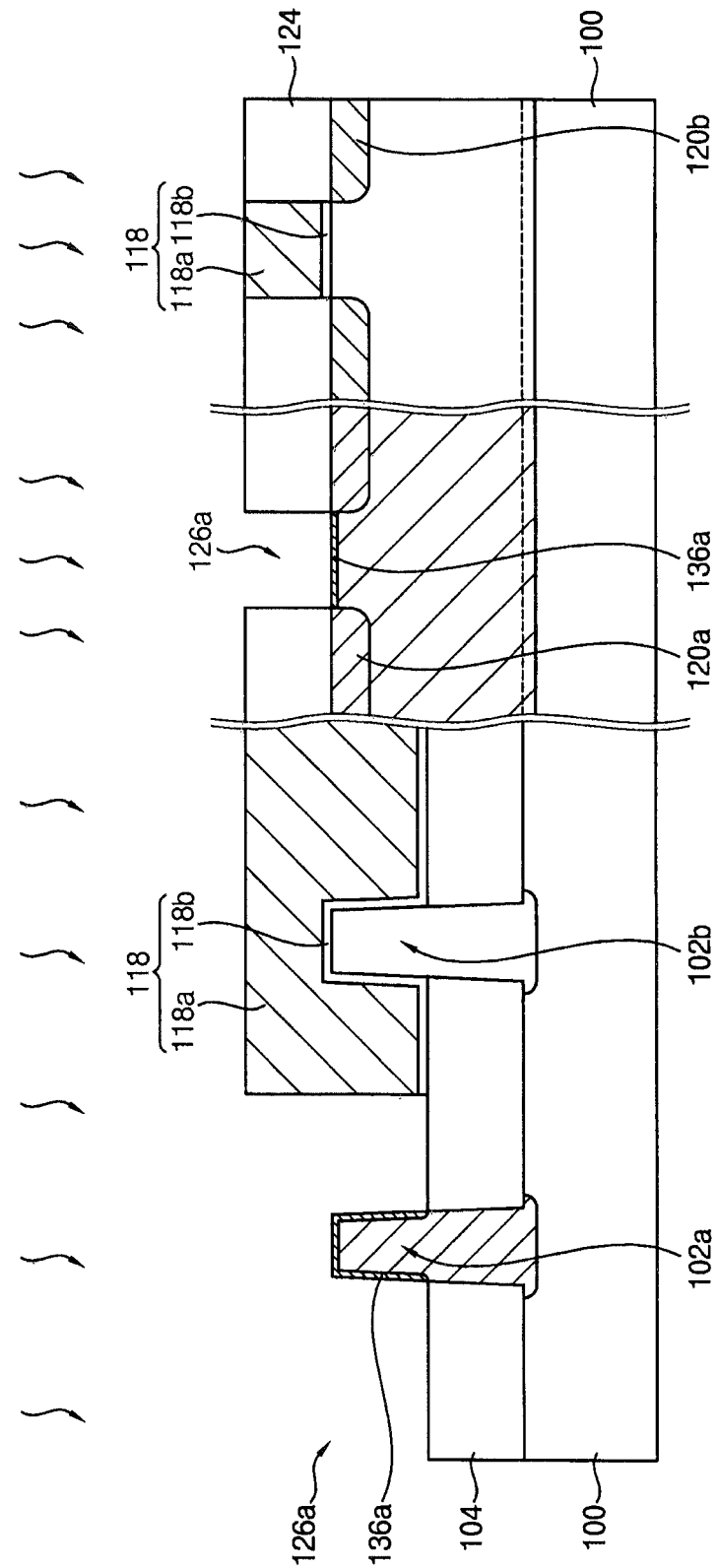
Figure 29:
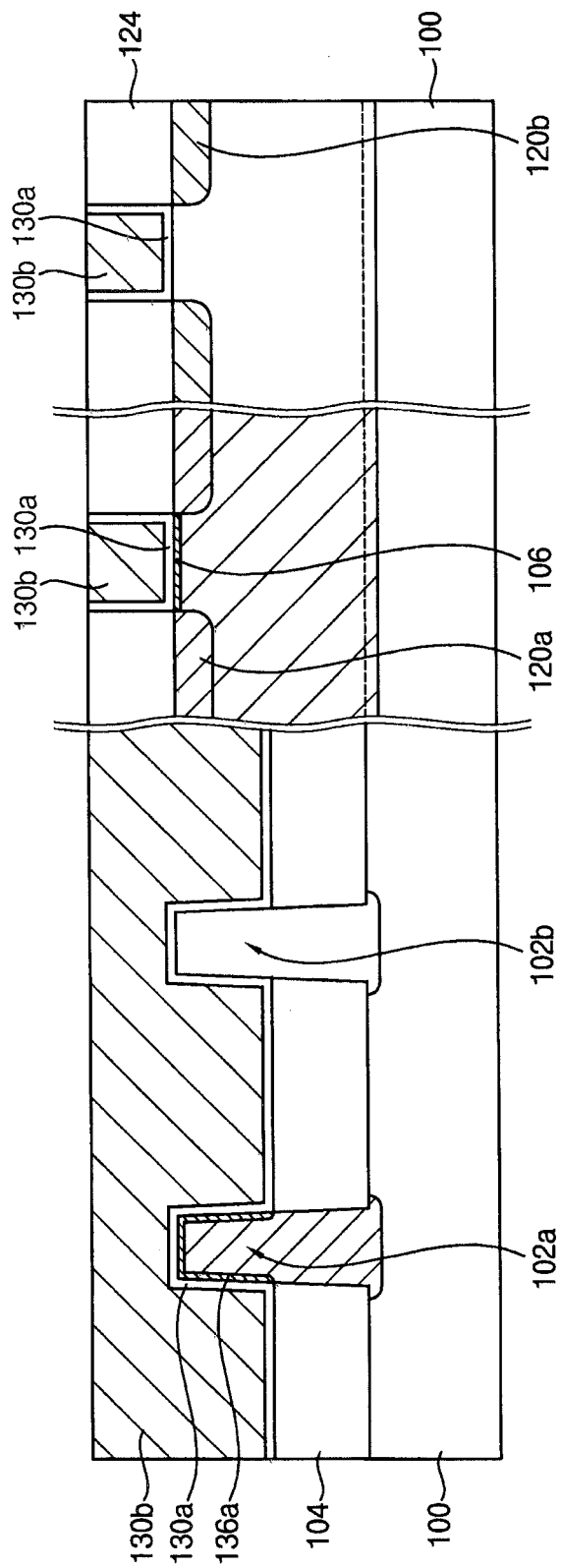

FIGS. 28 and 29 are cross-sectional views illustrating stages of a method of manufacturing a semiconductor device in accordance with example embodiments.

In the present embodiment, process substantially the same as or similar to that illustrated with reference to FIGS. 15A and 15B may be performed to form a structure, as shown in FIGS. 15A and 15B. Then, a process substantially the same as or similar to that illustrated with reference to FIG. 25 may be performed to form a structure, as shown in FIG. 25.

Referring to FIG. 28, an exposed dummy gate structure 118 of a transistor of which a threshold voltage needs to be controlled may be selectively removed to form a preliminary opening 126a.

For example, when a threshold voltage of an NMOS transistor needs to be controlled, the dummy gate structure formed on the first active fin 102a may be removed, as shown in FIG. 28.

A plasma annealing may be performed while supplying a threshold voltage control gas onto the substrate 100 through the preliminary opening 126a. In the plasma annealing, fixed charge regions 136a may be formed at channel regions of the first active fin 102a by the threshold voltage control gas penetrating into the first active fin 102a. However, the threshold voltage control gas may not penetrate into the second active fin 102b, because the dummy gate structure 118 and the insulating interlayer 124 is still present to cover the second active fin 102b. Thus, the fixed charge region 136a may not be formed at a surface of the second active fin 102b. That is, the threshold voltage of one of NMOS and PMOS transistors subsequently formed may be controlled. The plasma annealing may be performed under process conditions substantially the same as or similar to those illustrated with reference to FIGS. 16A and 16B.

Referring to FIG. 29, the remaining dummy gate structure 118 may be removed to form an opening (not shown).

A high-k dielectric layer may be formed on a bottom surface and a sidewall of the opening and the insulating interlayer 124, and a gate electrode layer may be formed on the high-k dielectric layer to sufficiently fill the opening. The gate electrode layer and the high-k dielectric layer may be planarized until a top surface of the insulating interlayer 124 may be exposed. Thus, a high-k dielectric pattern 130a and a gate electrode 130b may be formed in the opening. In example embodiments, the planarization process may be performed by a CMP process and/or an etch back process.

In example embodiments, the fixed charge regions 136a may be formed at the channel regions of the first and second active fins 102a and 102b. By the above processes, a CMOS transistor including the NMOS and PMOS transistors and having a target threshold voltage may be manufactured.

Figure 30:
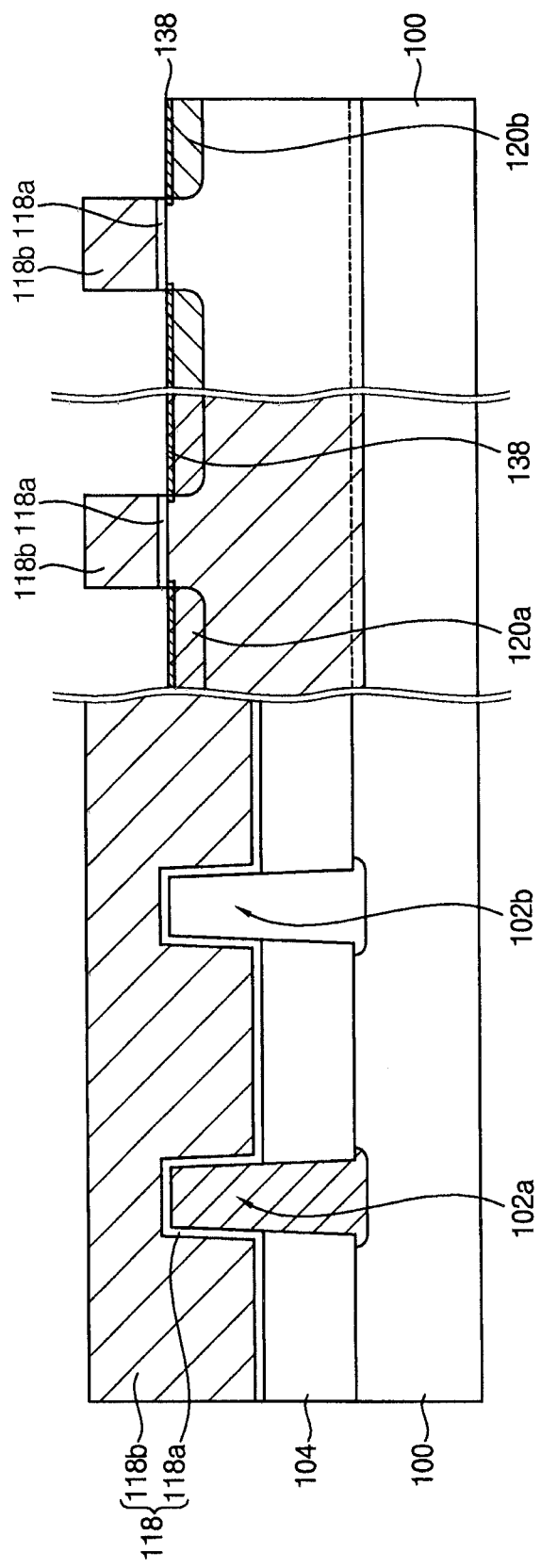
Figure 31:
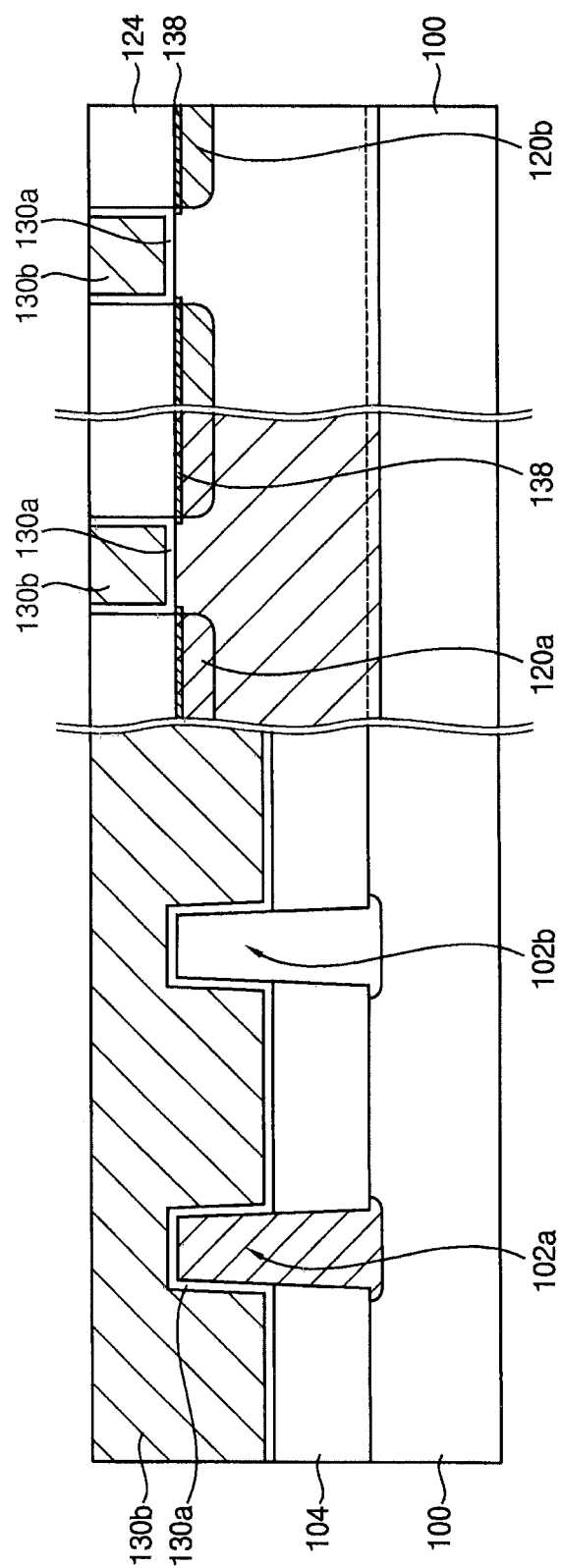

FIGS. 30 and 31 are cross-sectional views illustrating stages of a method of manufacturing a semiconductor device in accordance with example embodiments.

A process substantially the same as or similar to that illustrated with reference to FIGS. 15A and 15B may be performed to form a structure, as shown in FIGS. 15A and 15B.

Referring to FIG. 30, a dummy gate structure 118 may be formed on the substrate 100. The dummy gate structure 118 may be formed on the first and second active fins 102a and 102b, and may extend in the second direction.

A plasma annealing may be performed while supplying a threshold voltage control gas onto the dummy gate structure 118 and the substrate 100, so that fixed charge regions 138 may be formed at source and drain regions 120a and 120b, and edge portions of channel regions of the first and second active fins 102a and 102b.

N-type impurities may be doped onto the first active fin 102a by an ion implantation process to form the first source and drain regions 120a at upper portions of the first active fin 102a adjacent to the dummy gate structure 118. Also, p-type impurities may be doped onto the second active fin 102b by an ion implantation process to form second source and drain regions 120b at upper portions of the second active fin 102b adjacent to the dummy gate structure 118.

Referring to FIG. 31, an insulating interlayer 124 covering the dummy gate structure 118 may be formed on the substrate 100, and the insulating interlayer 124 may be planarized until a top surface of the dummy gate structure 118 may be exposed.

The exposed dummy gate structure 118 may be removed to form an opening (not shown). A high-k dielectric layer may be formed on a bottom surface and a sidewall of the opening and the insulating interlayer 124, and a gate electrode layer may be formed on the high-k dielectric layer to sufficiently fill the opening. The gate electrode layer and the high-k dielectric layer may be planarized until a top surface of the insulating interlayer 124 may be exposed. Thus, a high-k dielectric pattern 130a and a gate electrode 130b may be formed in the opening.

In example embodiments, the fixed charge regions 138 may be formed at the source and drain regions 120a and 120b, and edge portions of the channel regions of the first and second active fins 102a and 102b, respectively. By the above processes, a CMOS transistor including the NMOS and PMOS transistors and having a target threshold voltage may be manufactured.

Figure 32:
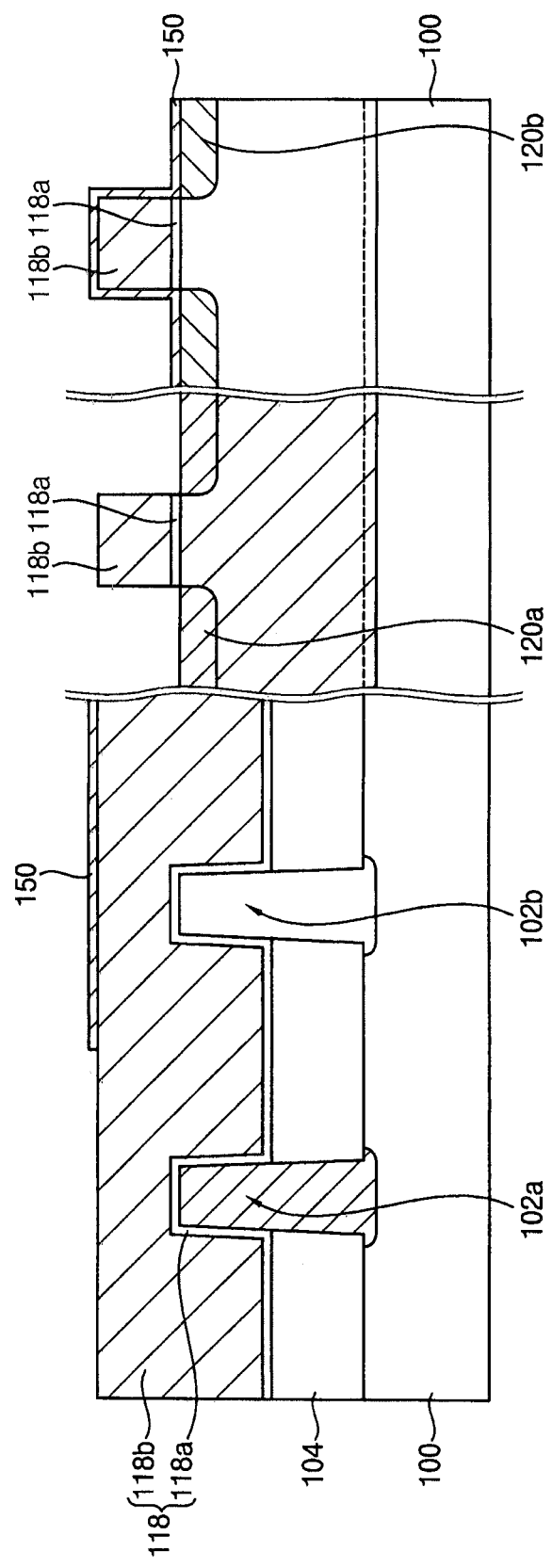
Figure 33:
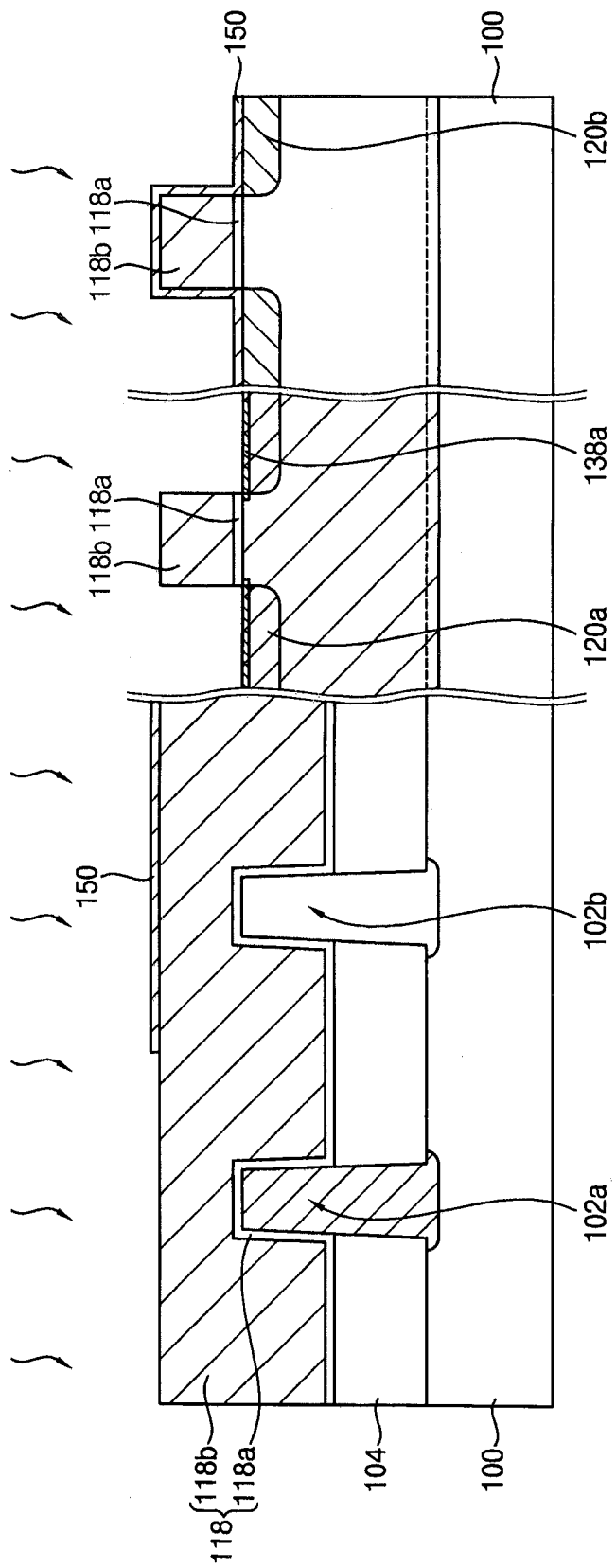
Figure 34:
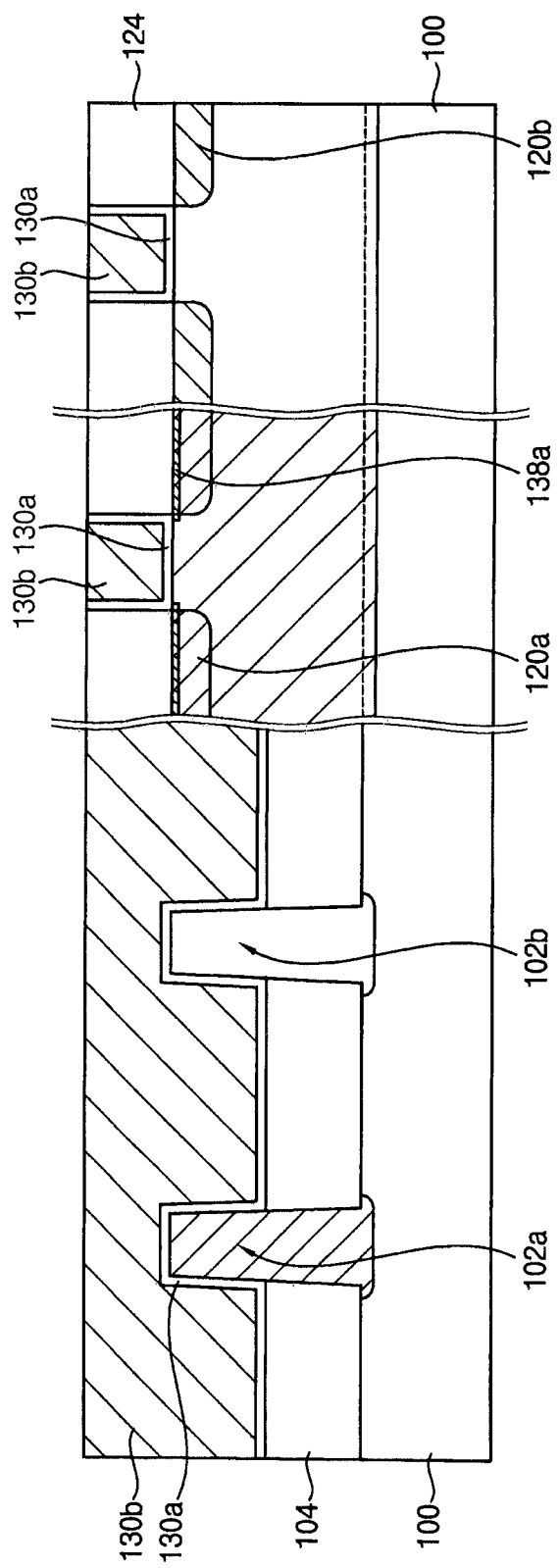

FIGS. 32 to 34 are cross-sectional views illustrating stages of a method of manufacturing a semiconductor device in accordance with example embodiments.

A process substantially the same as or similar to that illustrated with reference to FIGS. 15A and 15B may be performed to form a structure, as shown in FIGS. 15A and 15B.

Referring to FIG. 32, a dummy gate structure 118 may be formed on the substrate 100. The dummy gate structure 118 may be formed on the first and second active fins 102a and 102b, and may extend in the second direction.

N-type impurities may be doped onto the first active fin 102a by an ion implantation process to form first source and drain regions 120a at upper portions of the first active fin 102a adjacent to the dummy gate structure 118. Also, p-type impurities may be doped onto the second active fin 102b by an ion implantation process to form second source and drain regions 120b at upper portions of the second active fin 102b adjacent to the dummy gate structure 118.

A blocking layer may be formed on the dummy gate structure 118 and the substrate 100. The blocking layer may be formed on the surface of the first and second active fin 102a and 102b, the dummy gate structure 118 and the isolation layer 104. The blocking layer may prevent a threshold voltage control gas from penetrating into the first and/or second active fins 102a and/or 102b. The blocking layer may be formed to include, e.g., silicon oxide, silicon nitride, spin on hard mask, etc.

The blocking layer may be partially etched to form a blocking layer pattern 150. The blocking layer pattern 150 may be formed to expose one of the active fins 102a and 102b and dummy gate structure 118 of a transistor of which a threshold voltage needs to be controlled. For example, when a threshold voltage of the NMOS transistor needs to be controlled, the blocking layer pattern 150 may be formed to expose the first active fin 102a and the dummy gate structure 118 on the first active fin 102a, as shown in FIG. 32. Thus, the blocking layer pattern 150 may cover the second active fin 102b and the dummy gate structure 118 on the second active fin 102b.

Referring to FIG. 33, a plasma annealing may be performed while supplying a threshold voltage control gas onto the blocking layer pattern 150 and the substrate 100. In the plasma annealing, a fixed charge region 138a may be formed at the first active fins 102a by the threshold voltage control gas penetrating into the first active fin 102*a*. That is, the fixed charge regions 138*a* may be formed at the first source and drain regions 120*a*, and an edge portion of a channel region of the first active fin 102*a*. However, the fixed charge region 138*a* may not be formed at the second active fin 102*b*, because the threshold voltage control gas may not penetrate into the second active fin 102*b* by the blocking layer pattern 150 on the second active fin 102*b*. Thus, the threshold voltage of one of NMOS and PMOS transistors subsequently formed may be selectively controlled.

After the plasma annealing, the blocking layer pattern 150 may be removed. Alternately, when the blocking layer pattern 150 includes an insulation material, the blocking layer pattern 150 may not be removed.

Referring to FIG. 34, an insulating interlayer 124 covering the dummy gate structure 118 may be formed on the substrate 100, and the insulating interlayer 124 may be planarized until a top surface of the dummy gate structure 118 may be exposed.

The exposed dummy gate structure 118 may be removed to form an opening (not shown). A high-k dielectric layer may be formed on a bottom surface and a sidewall of the opening and the insulating interlayer 124, and a gate electrode layer may be formed on the high-k dielectric layer to sufficiently fill the opening. The gate electrode layer and the high-k dielectric layer may be planarized until a top surface of the insulating interlayer 124 may be exposed. Thus, a high-k dielectric pattern 130*a* and a gate electrode 130*b* may be formed in the opening.

In example embodiments, the fixed charge region 138*a* may be formed at the source and drain regions, and the edge portion of a channel region of any one of the first and second active fins 102*a* and 102*b*. By the above processes, a CMOS transistor including the NMOS and PMOS transistors and having a target threshold voltage may be manufactured.

Figure 35:
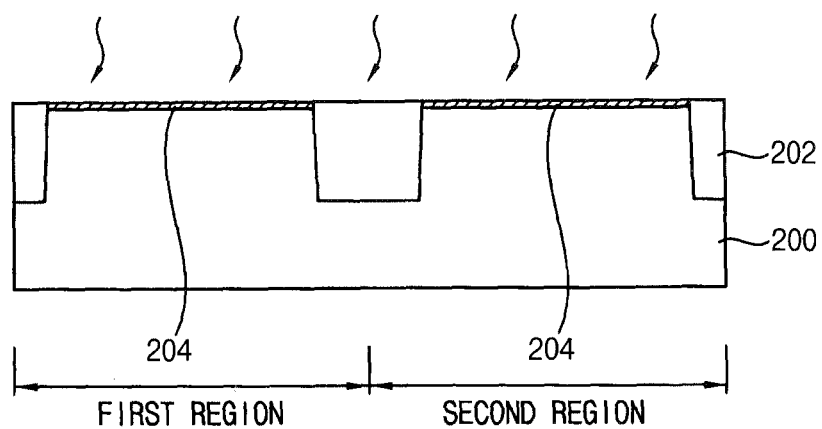
Figure 36:
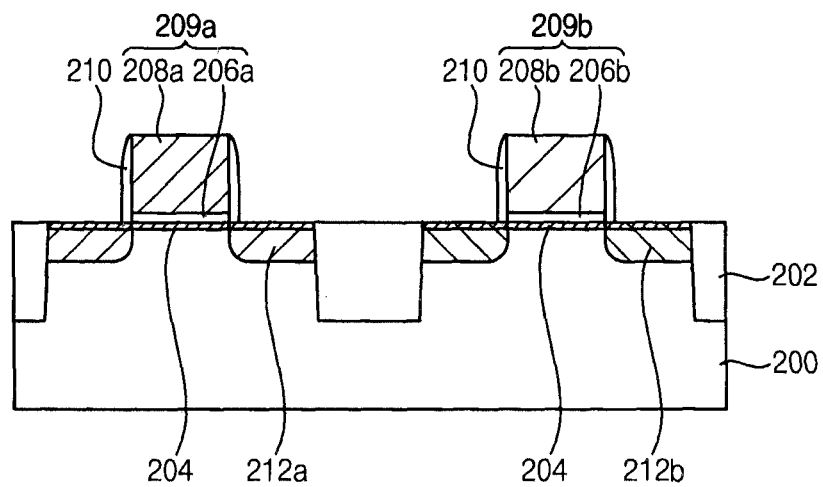

FIGS. 35 and 36 are cross-sectional views illustrating stages of a method of manufacturing a semiconductor device in accordance with example embodiments.

Referring to FIG. 35, an isolation layer 202 may be formed on a substrate 200 by a shallow trench isolation (STI) process. The substrate 200 may be divided into a field region on which the isolation layer 202 is formed and an active region on which no isolation layer 202 is formed. Also, the substrate 200 may be divided into a first region on which an NMOS transistor is formed and a second region on which a PMOS transistor is formed. The first region of the substrate 200 may be doped with p-type impurities, and the second region of the substrate 200 may be doped with n-type impurities.

A plasma annealing may be performed while supplying a threshold voltage control gas onto the substrate 200. By the plasma annealing, fixed charge regions 204 including fixed charges for controlling the threshold voltage may be formed at a surface of the substrate 204. The plasma annealing may be substantially the same as or similar to that illustrated with reference to FIGS. 2A and 2B. The fixed charge regions 204 may be formed at channel regions and source and drain regions of the NMOS and PMOS transistor, respectively.

Referring to FIG. 36, first and second gate structures 209*a* and 209*b* may be formed at the first and second regions of the substrate 200, respectively. Particularly, a gate insulation layer, a gate electrode layer and a mask layer (not shown) may be sequentially formed on the substrate 200. The mask layer may be patterned by a photolithography process to form a gate mask (not shown), and the gate electrode layer and the gate insulation layer may be etched using the gate mask as an etching mask to form the first and second gate structures 209*a* and 209*b*. The first gate structure 209*a* may include a first gate insulation layer pattern 206*a* and a first gate electrode 208*a* sequentially stacked on the first region of the substrate 200. The second gate structure 209*b* may include a second gate insulation layer pattern 206*b* and a second gate electrode 208*b* sequentially stacked on the second region of the substrate 200. Insulative spacers 210 may be formed on sidewalls of the first and second gate structures 209*a* and 209*b*.

N-type impurities may be doped onto the substrate 200 by an ion implantation process to form first source and drain regions 212*a* at upper portions of the substrate 200 adjacent to the first gate structure 209*a*. P-type impurities may be doped onto the substrate 200 by an ion implantation process to form second source and drain regions 212*b* at upper portions of the substrate 200 adjacent to the second gate structure 209*b*.

In example embodiments, the fixed charge region 204 may be formed at a surface of the active region. By the above processes, the semiconductor device may be manufactured to include the NMOS and PMOS transistor having target threshold voltages.

Figure 37:
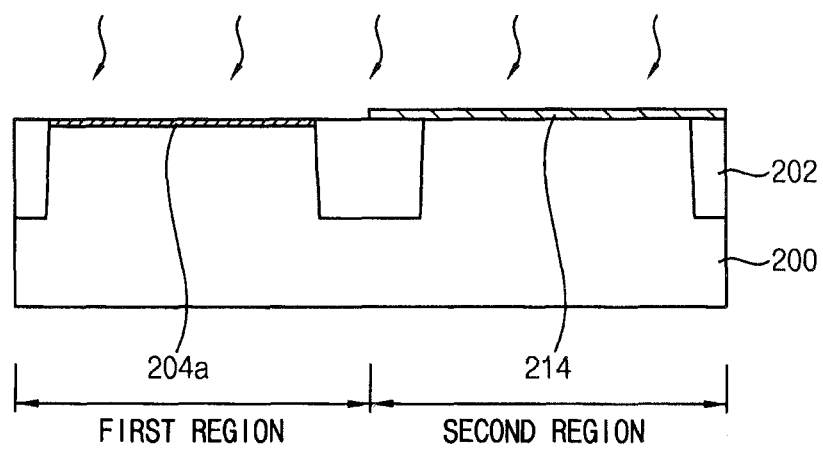
Figure 38:
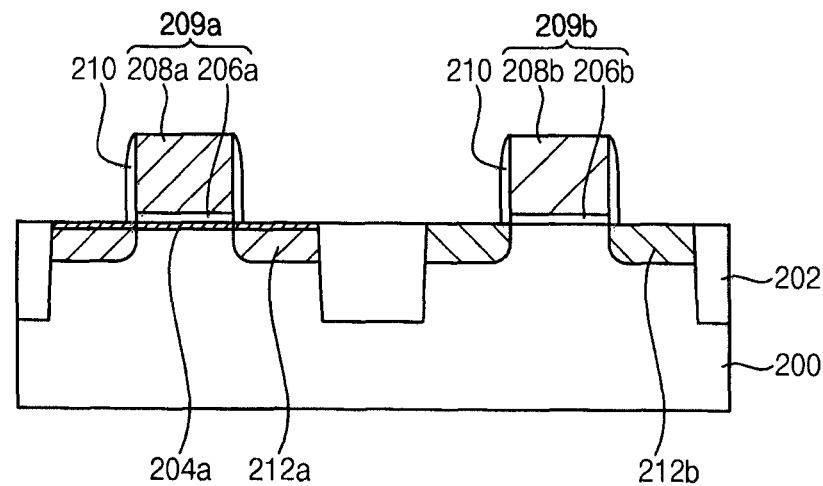

FIGS. 37 and 38 are cross-sectional views illustrating stages of a method of manufacturing a semiconductor device in accordance with example embodiments.

Referring to FIG. 37, an isolation layer 202 may be formed on a substrate 200 by a STI process. The substrate 200 may be divided into a first region on which an NMOS transistor is formed and a second region on which a PMOS transistor is formed.

The blocking layer pattern 214 may be formed on the substrate 200. The blocking layer pattern 214 may be formed to expose a top surface of the substrate 200 on which a transistor, of which a threshold voltage needs to be controlled, may be formed. For example, when a threshold voltage of the NMOS transistor needs to be controlled, the blocking layer pattern 214 may be formed to expose the first region of the substrate 200 and to cover the second region of the substrate 200, as shown in FIG. 37.

A plasma annealing may be performed while supplying a threshold voltage control gas onto the substrate 200. By the plasma annealing, a fixed charge region 204*a* including a fixed charge for controlling the threshold voltage may be formed at the first region of the substrate 200, and not at the second region of the substrate. The plasma annealing may be substantially the same as or similar to that illustrated with reference to FIGS. 2A and 2B.

Referring to FIG. 38, the blocking layer pattern 214 may be removed. First and second gate structures 209*a* and 209*b* may be formed at the first and second regions of the substrate 200, respectively. Spacers 210 may be formed on sidewalls of the first and second gate structures 209*a* and 209*b*. N-type impurities may be doped onto the first region of substrate 200 to form first source and drain regions 212*a* at upper portions of the substrate 200 adjacent to the first gate structure 209*a*. P-type impurities may be doped onto the second region of the substrate 200 to form second source and drain regions 212*b* at upper portions of the substrate 200 adjacent to the second gate structure 209*b*.

In example embodiments, the fixed charge region 204*a* may be formed at the surface of the active region on which a transistor, of which the threshold voltage needs to be controlled, may be formed. By the above processes, the semiconductor device may be manufactured to include the NMOS and PMOS transistor having target threshold voltages.

Figure 39:
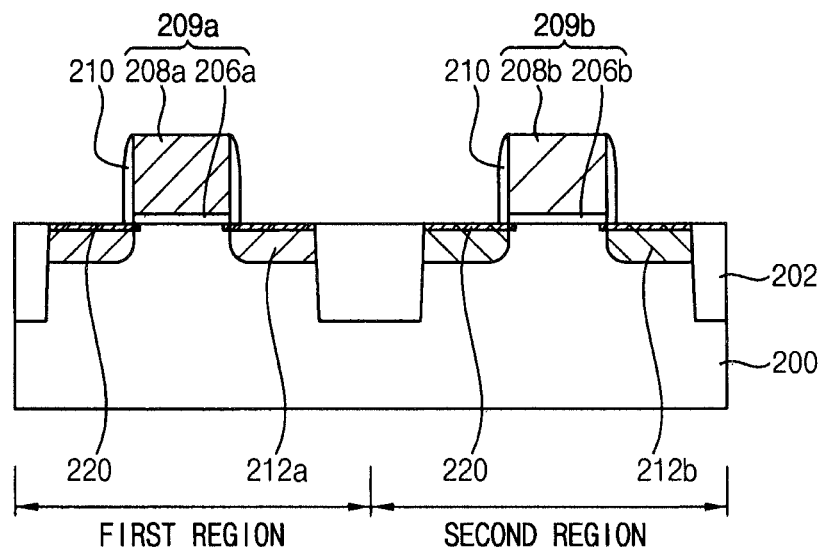

FIG. 39 is cross-sectional view illustrating stages of a method of manufacturing a semiconductor device in accordance with example embodiments.

Referring to FIG. 39, an isolation layer 202 may be formed on a substrate 200 by a STI process. The substrate 200 may be divided into a first region on which an NMOS transistor is formed and a second region on which a PMOS transistor is formed. First and second gate structures 209a and 209b may be formed at the first and second regions, respectively.

A plasma annealing may be performed while supplying a threshold voltage control gas onto the first and second gate structures 209a and 209b and substrate 200. By the plasma annealing with the gate structures 209a, 209b present, fixed charge regions 220 may be formed at first source and drain regions and an edge portion of a first channel region in the NMOS transistor and second source and drain regions, and an edge portion of a second channel region in the PMOS transistor, respectively.

Spacers 210 may be formed on sidewalls of the first and second gate structures 209a and 209b. N-type impurities may be doped onto the substrate 200 to form the first source and drain regions 212a at upper portions of the substrate 200 adjacent to the first gate structure 209a. P-type impurities may be doped onto the substrate 200 to form the second source and drain regions 212b at upper portions of the substrate 200 adjacent to the second gate structure 209b.

By the above processes, the semiconductor device may be manufactured to include the NMOS and PMOS transistors having target threshold voltages.

Figure 40:
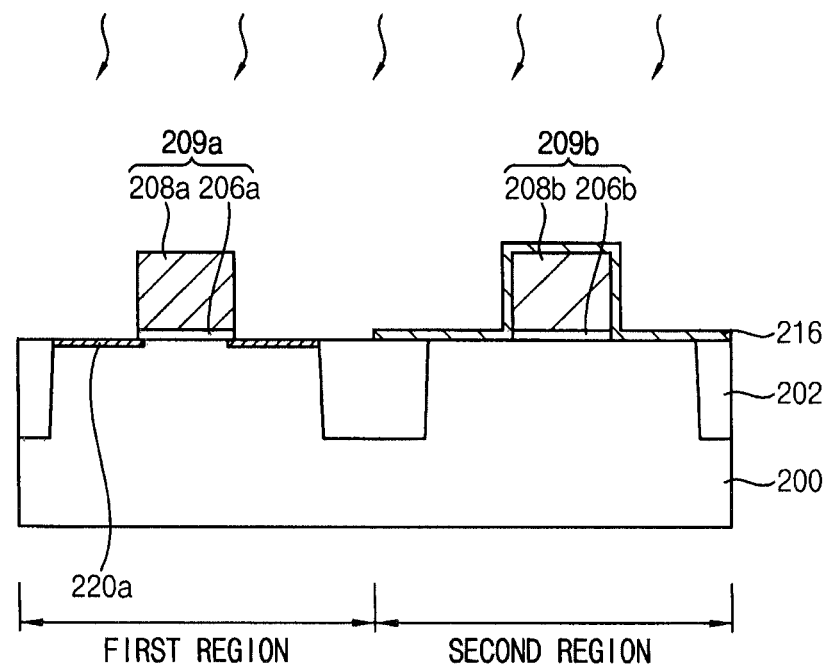
Figure 41:
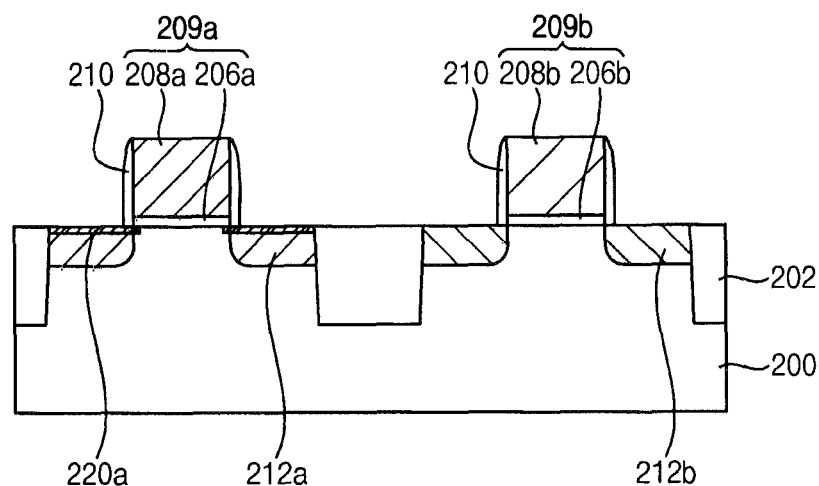

FIGS. 40 and 41 are cross-sectional views illustrating stages of a method of manufacturing a semiconductor device in accordance with example embodiments.

Referring to FIG. 40, an isolation layer 202 may be formed on a substrate 200 by a STI process. The substrate 200 may be divided into a first region on which an NMOS transistor is formed and a second region on which a PMOS transistor is formed. First and second gate structures 209a and 209b may be formed at the first and second regions, respectively.

The blocking layer pattern 216 may be formed on the first and second gate structures 209a and 209b and the substrate 200. The blocking layer pattern 216 may be formed to expose a top surface of the substrate 200 on which a transistor, of which a threshold voltage needs to be controlled, may be formed. For example, when a threshold voltage of the NMOS transistor needs to be controlled, the blocking layer pattern may be formed to expose the first region and to cover the second region, as shown in FIG. 40.

A plasma annealing may be performed while supplying a threshold voltage control gas onto the substrate 200. By the plasma annealing, a fixed charge region 220a may be formed at first source and drain regions 212a and an edge portion of a channel region in the NMOS transistor. The plasma annealing may be substantially the same as or similar to that illustrated with reference to FIGS. 2A and 2B.

Referring to FIG. 41, the blocking layer pattern 216 may be removed. Spacers 210 may be formed on sidewalls of the first and second gate structures 209a and 209b. N-type impurities may be doped onto the first region of the substrate 200 to form first source and drain regions 212a at upper portions of the substrate 200 adjacent to the first gate structure 209a. P-type impurities may be doped onto the second region of the substrate 200 to form second source and drain regions 212b at upper portions of the substrate 200 adjacent to the second gate structure 209b.

By the above processes, the semiconductor device may be manufactured to include the NMOS and PMOS transistor having target threshold voltages.

Figure 42:
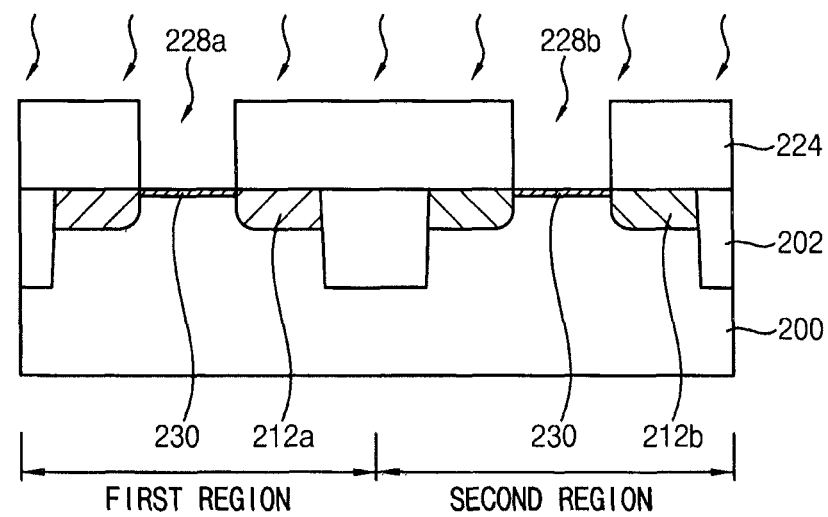
Figure 43:
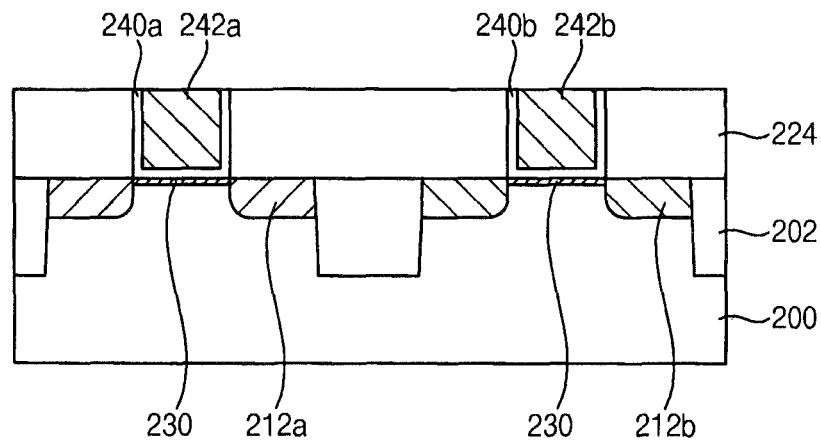

FIGS. 42 and 43 are cross-sectional views illustrating stages of a method of manufacturing a semiconductor device in accordance with example embodiments.

Referring to FIG. 42, an isolation layer 202 may be formed on a substrate 200 by a STI process. The substrate 200 may be divided into a first region on which an NMOS transistor is formed and a second region on which a PMOS transistor is formed. First and second dummy gate structures (not shown) may be formed at the first and second regions, respectively. N-type impurities may be doped onto the first region of the substrate 200 to form first source and drain regions 212a at upper portions of the substrate 200 adjacent to the first dummy gate structure. P-type impurities may be doped onto the second region of the substrate 200 to form second source and drain regions 212b at upper portions of the substrate 200 adjacent to the second dummy gate structure.

An insulating interlayer 224 covering the first and second dummy gate structures may be formed on the substrate 200, and the insulating interlayer 224 may be planarized until top surfaces of the first and second dummy gate structure may be exposed. The exposed dummy first and second gate structures may be removed to form first and second openings 228a and 228b, respectively.

A plasma annealing may be performed while supplying a threshold voltage control gas onto the substrate 200 through the first and second openings 228a and 228b. By the plasma annealing, fixed charge regions 230 including fixed charges for controlling the threshold voltage may be formed at channel regions of the NMOS and PMOS transistors. Thus, the threshold voltages of the NMOS and PMOS transistors may be simultaneously controlled.

Referring to FIG. 43, a first high-k dielectric pattern 240a and a first gate electrode 242a may be formed in the first opening 228a, and a second high-k dielectric pattern 240b and a second gate electrode 242a may be formed in the second opening 228b.

In example embodiments, the fixed charge regions 230 may be formed at the channel regions of the NMOS and PMOS transistors, respectively. By the above processes, the semiconductor device may be manufactured to include the transistors having target threshold voltages.

Figure 44:
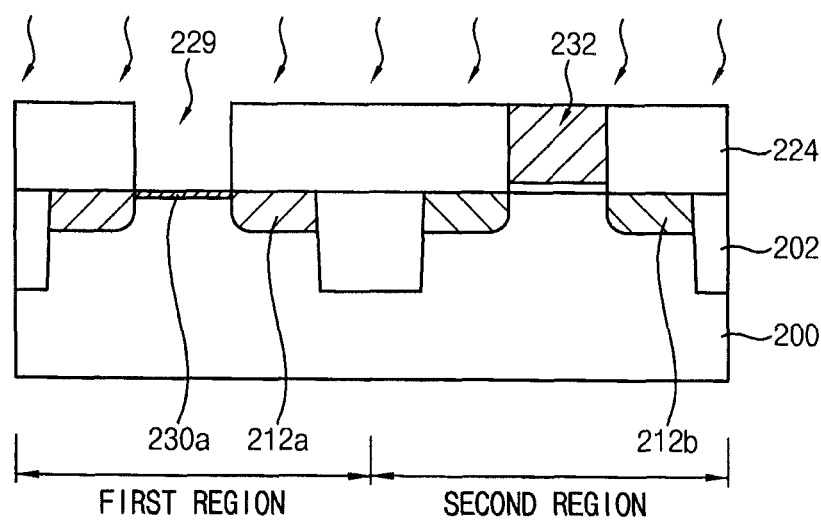
Figure 45:
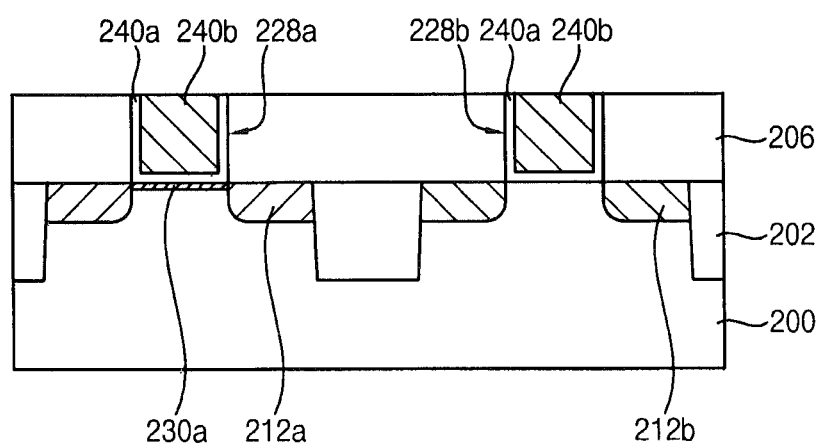

FIGS. 44 and 45 are cross-sectional views illustrating stages of a method of manufacturing a semiconductor device in accordance with example embodiments.

Referring to HQ 44, an isolation layer 202 may be formed on a substrate 200 by a STI process. The substrate 200 may be divided into a first region on which an NMOS transistor is formed and a second region on which a PMOS transistor is formed. First and second dummy gate structures may be formed at the first and second regions, respectively. N-type impurities may be doped onto the first region of the substrate 200 to form first source and drain regions 212a at upper portions of the substrate 200 adjacent to the first dummy gate structure (not shown). P-type impurities may be doped onto the second region of the substrate 200 to form second source and drain regions 212b at upper portions of the substrate 200 adjacent to the second dummy gate structure 232.

An insulating interlayer 224 covering the first and second dummy gate structures may be formed on the substrate 200, and the insulating interlayer 224 may be planarized until top surfaces of the first and second dummy gate structure may be exposed. A dummy gate structure of a transistor of which a threshold voltage needs to be controlled may be selectively removed to form a preliminary opening 229. For example, when a threshold voltage of the NMOS transistor needs to be controlled, the first dummy gate structure (not shown) may be removed, as shown in FIG. 44.

A plasma annealing may be performed while supplying a threshold voltage control gas onto the substrate 200 through the preliminary opening 229. By the plasma annealing, a fixed charge region 230a may be formed at channel regions of the NMOS transistor. Thus, the threshold voltage of the NMOS transistor may be controlled.

Referring to FIG. 45, the second dummy gate structure 232 may be removed to form first and second openings 228a and 228b through the insulating interlayer 224 of the first and second regions, respectively.

A first high-k dielectric pattern 240a and a first gate electrode 242b may be formed in the first opening 228a, and a second high-k dielectric pattern 240b and a second gate electrode 242b may be formed in the second opening 228b.

In example embodiments, the fixed charge region 230a may be formed at the channel region of a selected transistor. By the above processes, the semiconductor device may be manufactured to include the transistors having target threshold voltages.

EXPERIMENT

Example 1

In a first experiment, Example 1, an NMOS transistor was formed by the processes substantially in accordance with those illustrated with reference to FIGS. 1A, 1B, 2A, 2B, 3A, 3B, 4A and 4B.

Particularly, a bulk silicon substrate was used. A plasma annealing was performed at a temperature of about 500 C, and helium was used as the threshold voltage control gas. N-type impurities were doped onto the bulk silicon substrate to form source and drain regions. Thus, the NMOS transistor was manufactured on an active fin.

Example 2

In a second experiment, Example 2, a PMOS transistor was formed by the processes substantially the same as those illustrated with reference to FIGS. 1A, 1B, 2A, 2B, 3A, 3B, 4A and 4B.

Particularly, a bulk silicon substrate was used. A plasma annealing was performed at a temperature of about 500 C, and helium was used as the threshold voltage control gas. P-type impurities were doped onto the substrate to form source and drain regions. Thus, the POMS transistor was manufactured on an active fin.

Comparative Example 1

Comparative Example 1 was an NMOS transistor that was formed by processes substantially the same as the processes of forming Example 1, except that the plasma annealing was not performed.

Comparative Example 2

Comparative Example 2 was a PMOS transistor that was formed by processes substantially the same as the processes of forming Example 2, except that the plasma annealing was not performed.

Figure 46:
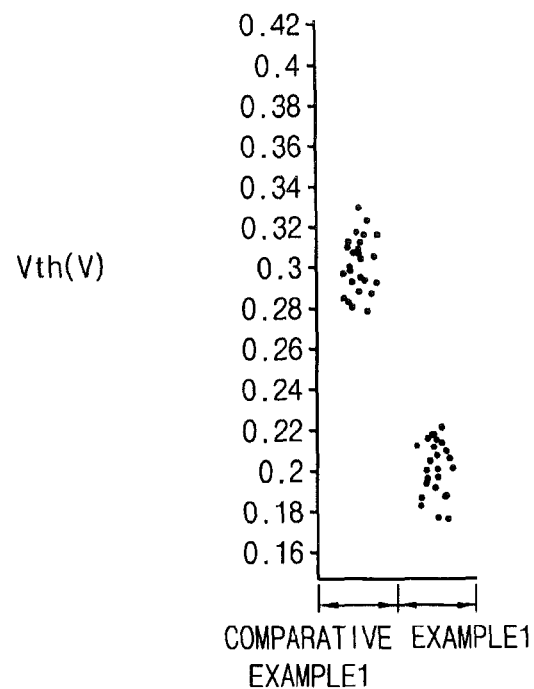
Figure 47:
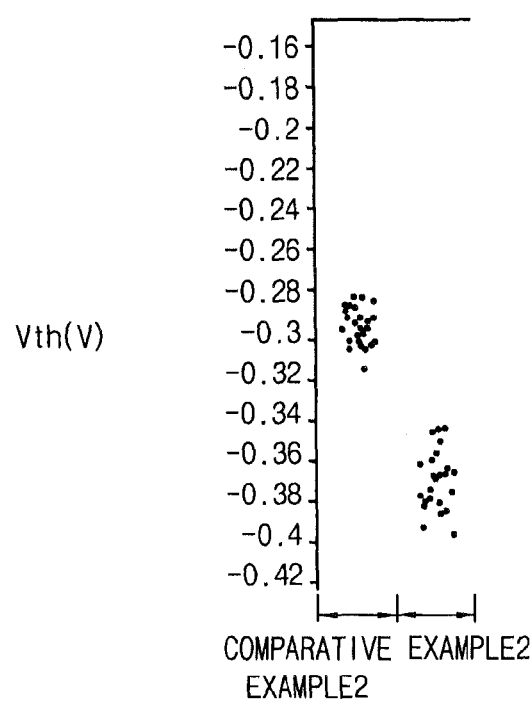

FIG. 46 is a graph illustrating threshold voltages of Example 1 and Comparative Example 1. FIG. 47 is a graph illustrating threshold voltages of Example 2 and Comparative Example 2.

Referring to FIG. 46, a threshold voltage of Example 1 is lower than a threshold voltage of Comparative example 1 by about 100 mV. The threshold voltage of the NMOS transistor was controlled by the plasma annealing and supplying the threshold voltage control gas. That is, a fixed charge region 16 including a positive fixed charge was formed at a surface of the active fin by the plasma annealing and supplying helium, so that the threshold voltage of the NMOS transistor decreased.

Referring to FIG. 47, a threshold voltage of Example 2 is lower than a threshold voltage of Comparative example 2 by about 80 mV. The threshold voltage of the PMOS transistor was controlled by the plasma annealing and supplying the threshold voltage control gas. That is, a fixed charge region 16 including a positive fixed charge was formed at a surface of the active fin by the plasma annealing and supplying the helium, so that the threshold voltage of the PMOS transistor decreased.

The above semiconductor device may be applied to various types of memory devices including MOS transistors. For example, the semiconductor device may be applied to logic devices such as central processing units (CPUs), main processing units (MPUs), or application processors (APs), etc. Additionally, the semiconductor device may be applied to volatile memory devices such as DRAM devices or SRAM devices, or non-volatile memory devices such as flash memory devices, PRAM devices, MRAM devices, RRAM devices, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising: performing a plasma annealing and supplying a threshold voltage control gas onto a portion of a substrate to form a fixed charge region including a fixed charge at a surface of the substrate; and forming a MOS transistor on the substrate including the fixed charge region for controlling a threshold voltage of the MOS transistor, wherein the threshold voltage control gas has an atomic number smaller than that of an element of the substrate, and wherein the threshold voltage control as is supplied onto source and drain regions of the MOS transistor in the substrate, and wherein the fixed charge region is formed at the source and drain regions, and an edge portion of a channel region of the MOS transistor.

2. The method of claim 1, wherein the threshold voltage control gas is supplied onto the channel region of the MOS transistor in the substrate, and wherein the fixed charge region is formed at the channel region.

3. The method of claim 1, before performing the plasma annealing and supplying the threshold voltage control gas, further comprising forming a blocking layer pattern on the substrate.

4. The method of claim 1, wherein the threshold voltage control gas includes at least one selected from the group consisting of H, $H_2$, $D_2$ (deuterium), He, C and F.

5. The method of claim 1, wherein the plasma annealing is performed at a temperature of about 400 C. to about 600 C.

6. The method of claim 1, before performing the plasma annealing and supplying the threshold voltage control gas, further comprising forming an active fin and isolation layer on the substrate.

7. The method of claim 1, wherein forming the MOS transistor includes:
    forming a gate structure including a gate insulation layer and a gate electrode sequentially stacked on the substrate including the fixed charge region; and
    forming an impurity region at an upper portion of the substrate adjacent to the gate structure.

8. A method of manufacturing a semiconductor device, the method comprising: forming an active fin and isolation layer on a substrate; performing a plasma annealing and supplying a threshold voltage control gas onto the substrate to form a fixed charge region including a fixed charge at a surface of the substrate; forming a gate structure including a gate insulation layer and a gate electrode sequentially stacked on the substrate including the fixed charge region for controlling a threshold voltage of the MOS transistor; and forming an impurity region at an upper portion of the substrate adjacent to the gate structure, wherein the threshold voltage control gas has an atomic number smaller than that of an element of the substrate, and wherein the threshold voltage control gas is supplied onto source and drain regions of the MOS transistor in the substrate, and wherein the fixed charge region is formed at the source and drain regions, and an edge portion of a channel region of the MOS transistor.

9. The method of claim 8, wherein the substrate includes a first region for forming a first transistor of a first conductivity and a second region for forming a second transistor of a second conductivity, and wherein the method further comprises forming blocking layer pattern to cover the first or second region of the substrate so that the threshold voltage control gas is supplied onto an exposed portion of the substrate between the blocking layer pattern.

10. The method of claim 8, wherein the threshold voltage control gas is supplied onto the channel region of the MOS transistor in the substrate, and wherein the fixed charge region is formed at the channel region.

11. The method of claim 8, before performing the plasma annealing and supplying the threshold voltage control gas, further comprising forming a gate insulation layer on the substrate.

12. A method of manufacturing a semiconductor device, comprising: performing a plasma annealing on a region of a substrate while supplying a threshold voltage supply gas to form a fixed charge region; forming a transistor in the region of the substrate, the transistor including the fixed charge region, a threshold voltage of the transistor being controlled in accordance with the plasma annealing while supplying the threshold voltage supply gas, wherein the threshold voltage control gas has an atomic number smaller than that of an element of the substrate, and wherein the threshold voltage control gas is supplied onto source and drain regions of the transistor in the substrate, and wherein the fixed charge region is formed at the source and drain regions, and an edge portion of a channel region of the transistor.

13. The method of claim 12, wherein the fixed charge region is formed on a selected region of the substrate corresponding to the channel region of the transistor.

14. The method of claim 12, wherein performing the plasma annealing on a region of the substrate while supplying the threshold voltage supply gas to form the fixed charge region is performed through an opening formed as a result of the forming and removal of a dummy gate pattern.

15. The method of claim 12, wherein performing the plasma annealing on a region of the substrate while supplying the threshold voltage supply gas to form the fixed charge region is performed through a gate insulating layer of a gate of the resulting transistor.

* * * * *